(12) United States Patent
Campbell et al.

(10) Patent No.: US 8,248,801 B2
(45) Date of Patent: Aug. 21, 2012

(54) THERMOELECTRIC-ENHANCED, LIQUID-COOLING APPARATUS AND METHOD FOR FACILITATING DISSIPATION OF HEAT

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 12/845,355

(22) Filed: Jul. 28, 2010

(65) Prior Publication Data

US 2012/0024501 A1  Feb. 2, 2012

(51) Int. Cl.
*H05K 7/20* (2006.01)
*H05K 5/00* (2006.01)
*H05K 7/00* (2006.01)
*F28F 7/00* (2006.01)
*F28D 15/00* (2006.01)
*F25D 23/12* (2006.01)

(52) U.S. Cl. ........ 361/701; 361/699; 361/700; 361/702; 361/703; 361/715; 361/696; 361/718; 361/724; 361/728; 165/104.33; 165/80.2; 165/80.3; 165/80.4; 174/15.1; 174/16.3; 62/259.2

(58) Field of Classification Search .......... None
See application file for complete search history.

(56) References Cited

U.S. PATENT DOCUMENTS

| | | | |
|---|---|---|---|
| 3,578,014 A | 5/1971 | Gachot | |
| 4,430,866 A | 2/1984 | Willitts | |
| 4,698,728 A | 10/1987 | Tustaniwskyj et al. | |
| 5,269,146 A * | 12/1993 | Kerner | 62/3.6 |
| 5,285,347 A | 2/1994 | Fox et al. | |
| 5,323,847 A | 6/1994 | Koizumi et al. | |
| 5,552,960 A | 9/1996 | Nelson et al. | |
| 5,731,954 A | 3/1998 | Cheon | |

(Continued)

OTHER PUBLICATIONS

Campbell et al., "System and Method for Facilitating Parallel Cooling of Liquid-Cooled Electronics Racks", U.S. Appl. No. 12/556,053, filed Sep. 9, 2009.

(Continued)

*Primary Examiner* — Bradley Thomas
(74) *Attorney, Agent, or Firm* — Dennis Jung, Esq.; Kevin P. Radigan, Esq.; Heslin Rothenberg Farley & Mesiti P.C.

(57) ABSTRACT

Thermoelectric-enhanced, liquid-cooling apparatus and method are provided for facilitating cooling of one or more components of an electronics rack. The apparatus includes a liquid-cooled structure in thermal communication with the component(s) to be cooled, and a liquid-to-air heat exchanger coupled in fluid communication with the liquid-cooled structure via a coolant loop for receiving coolant from and supply coolant to the liquid-cooled structure. A thermoelectric array is disposed with first and second coolant loop portions in thermal contact with first and second sides of the array. The thermoelectric array operates to transfer heat from coolant passing through the first loop portion to coolant passing through the second loop portion, and cools coolant passing through the first loop portion before the coolant passes through the liquid-cooled structure. Coolant passing through the first and second loop portions passes through the liquid-to-air heat exchanger for cooling thereof.

20 Claims, 16 Drawing Sheets

U.S. PATENT DOCUMENTS

| | | | |
|---|---|---|---|
| 5,782,101 A | 7/1998 | Dennis | |
| 5,829,264 A | 11/1998 | Ishigaki et al. | |
| 5,898,568 A | 4/1999 | Cheng | |
| 5,970,731 A | 10/1999 | Hare et al. | |
| 6,094,347 A | 7/2000 | Bhatia | |
| 6,161,612 A | 12/2000 | Stahl et al. | |
| 6,166,907 A | 12/2000 | Chien | |
| 6,212,895 B1 | 4/2001 | Richardson | |
| 6,275,945 B1 | 8/2001 | Tsuji et al. | |
| 6,276,448 B1 | 8/2001 | Maruno | |
| 6,353,536 B1 | 3/2002 | Nakamura et al. | |
| 6,374,627 B1 | 4/2002 | Schumacher et al. | |
| 6,459,575 B1 | 10/2002 | Esterberg | |
| 6,489,551 B2 | 12/2002 | Chu et al. | |
| 6,548,894 B2 | 4/2003 | Chu et al. | |
| 6,557,354 B1 | 5/2003 | Chu et al. | |
| 6,574,104 B2 | 6/2003 | Patel et al. | |
| 6,606,254 B2 | 8/2003 | Yoneda | |
| 6,616,524 B2 | 9/2003 | Storck et al. | |
| 6,687,123 B2 | 2/2004 | Kitahara | |
| 6,705,089 B2 | 3/2004 | Chu et al. | |
| 6,775,997 B2 | 8/2004 | Bash et al. | |
| 6,819,563 B1 | 11/2004 | Chu et al. | |
| 6,826,047 B1 | 11/2004 | Chen et al. | |
| 6,832,489 B2 | 12/2004 | Bash et al. | |
| 6,966,358 B2 | 11/2005 | Rapaich | |
| 6,967,842 B2 * | 11/2005 | Aoki et al. | 361/701 |
| 7,012,807 B2 | 3/2006 | Chu et al. | |
| 7,019,968 B2 | 3/2006 | Kitahara | |
| 7,068,509 B2 | 6/2006 | Bash et al. | |
| 7,088,585 B2 | 8/2006 | Chu et al. | |
| 7,106,590 B2 | 9/2006 | Chu et al. | |
| 7,120,021 B2 | 10/2006 | Hamman | |
| 7,143,605 B2 | 12/2006 | Rohrer et al. | |
| 7,149,084 B2 | 12/2006 | Matsushima et al. | |
| 7,174,738 B2 | 2/2007 | Scott | |
| 7,191,954 B2 | 3/2007 | Kline | |
| 7,203,063 B2 | 4/2007 | Bash et al. | |
| 7,222,502 B2 | 5/2007 | Kobayashi et al. | |
| 7,273,088 B2 | 9/2007 | Malone et al. | |
| 7,293,416 B2 | 11/2007 | Ghoshal | |
| 7,309,209 B2 | 12/2007 | Amiot et al. | |
| 7,325,046 B1 | 1/2008 | Novaes et al. | |
| 7,349,213 B2 | 3/2008 | Campbell et al. | |
| 7,385,810 B2 | 6/2008 | Chu et al. | |
| 7,392,823 B2 | 7/2008 | Dong et al. | |
| 7,403,384 B2 * | 7/2008 | Pflueger | 361/688 |
| 7,420,808 B2 | 9/2008 | Campbell et al. | |
| 7,477,514 B2 | 1/2009 | Campbell et al. | |
| 7,531,142 B2 | 5/2009 | Huziwara et al. | |
| 7,559,207 B2 | 7/2009 | Knight et al. | |
| 7,599,184 B2 * | 10/2009 | Upadhya et al. | 361/699 |
| 7,630,795 B2 | 12/2009 | Campbell et al. | |
| 7,647,787 B2 | 1/2010 | Belady et al. | |
| 7,660,109 B2 | 2/2010 | Iyengar et al. | |
| 7,743,614 B2 * | 6/2010 | Goenka et al. | 62/3.3 |
| 7,866,164 B2 * | 1/2011 | Rice | 62/3.3 |
| 8,035,972 B2 * | 10/2011 | Ostwald et al. | 361/699 |
| 2002/0015287 A1 | 2/2002 | Shao | |
| 2002/0105783 A1 | 8/2002 | Kitahara | |
| 2003/0188538 A1 * | 10/2003 | Chu et al. | 62/3.2 |
| 2003/0218865 A1 | 11/2003 | Macias | |
| 2004/0008483 A1 | 1/2004 | Cheon | |
| 2004/0025516 A1 * | 2/2004 | Van Winkle | 62/3.3 |
| 2004/0221604 A1 * | 11/2004 | Ota et al. | 62/259.2 |
| 2005/0068728 A1 | 3/2005 | Chu et al. | |
| 2005/0244280 A1 | 11/2005 | Malone et al. | |
| 2006/0037739 A1 | 2/2006 | Utsunomiya | |
| 2006/0082966 A1 | 4/2006 | Lev et al. | |
| 2006/0137359 A1 * | 6/2006 | Ghoshal | 62/3.7 |
| 2006/0137360 A1 * | 6/2006 | Ghoshal | 62/3.7 |
| 2006/0180300 A1 | 8/2006 | Lenehan et al. | |
| 2006/0187638 A1 * | 8/2006 | Vinson et al. | 361/698 |
| 2007/0119569 A1 | 5/2007 | Campbell et al. | |
| 2007/0121295 A1 | 5/2007 | Campbell et al. | |
| 2007/0297136 A1 | 12/2007 | Konshak | |
| 2008/0141703 A1 * | 6/2008 | Bean, Jr. | 62/434 |
| 2008/0205003 A1 | 8/2008 | Belady | |
| 2008/0259566 A1 * | 10/2008 | Fried | 361/699 |
| 2009/0080173 A1 | 3/2009 | Schmidt et al. | |
| 2009/0126909 A1 | 5/2009 | Ellsworth, Jr. et al. | |
| 2009/0126910 A1 | 5/2009 | Campbell et al. | |
| 2009/0133866 A1 | 5/2009 | Campbell et al. | |
| 2009/0156114 A1 | 6/2009 | Ahladas et al. | |
| 2009/0249796 A1 * | 10/2009 | Ullman | 62/3.7 |
| 2010/0000229 A1 | 1/2010 | Tindale et al. | |
| 2010/0101759 A1 | 4/2010 | Campbell et al. | |
| 2010/0101765 A1 | 4/2010 | Campbell et al. | |
| 2010/0170663 A1 * | 7/2010 | Bean, Jr. | 165/104.33 |
| 2011/0277967 A1 * | 11/2011 | Fried et al. | 165/104.26 |

OTHER PUBLICATIONS

Campbell et al., "Condenser Structures with Fin Cavities Facilitating Vapor Condensation Cooling of Coolant", U.S. Appl. No. 12/491,287, filed Jun. 25, 2009.

Schmidt et al., "Challenges of Data Center Thermal Management", IBM Journal of Research & Development, vol. 49, No. 4/5, pp. 709-723 (Jul./Sep. 2005).

Zamanabadi et al., "Hybrid Control Challenges in Refrigeration Systems", Danfoss A/S, Denmark, Advanced Engineering—Refrigeration and Air Conditioning, EECI (2007).

Bilski et al., "Electronics Cooling of a Self-Contained, Sub-Cooled Pumped Liquid System", 24th IEEE Semi-Therm Symposium, pp. 137-141 (Jul. 2008).

Ellsworth, Jr. et al., "The Evolution of Water Cooling for IBM Larger Server Systems: Back to the Future", IBM Corporation, Poughkeepsie, NY (2008).

Simons et al., "Application of Thermoelectric Cooling to Electronic Equipment: A Review and Analysis", IBM Corporation, Poughkeepsie, NY (2000).

Torok et al., "Packaging Design of the IBM System z10 Enterprise Class Platform Central Electronic Complex", IBM Journal of Research & Development, vol. 53, No. 1, Paper 9 (2009).

* cited by examiner

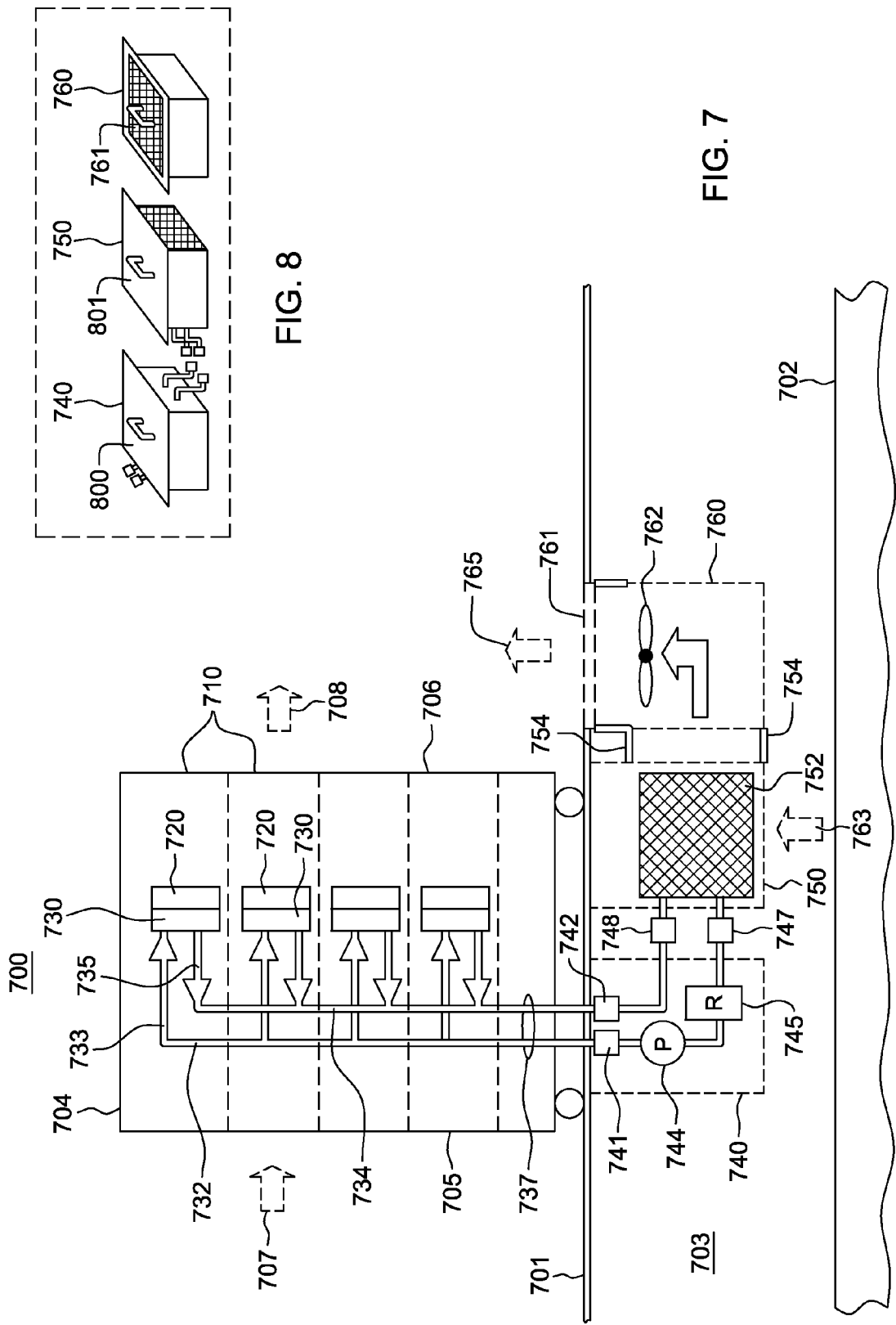

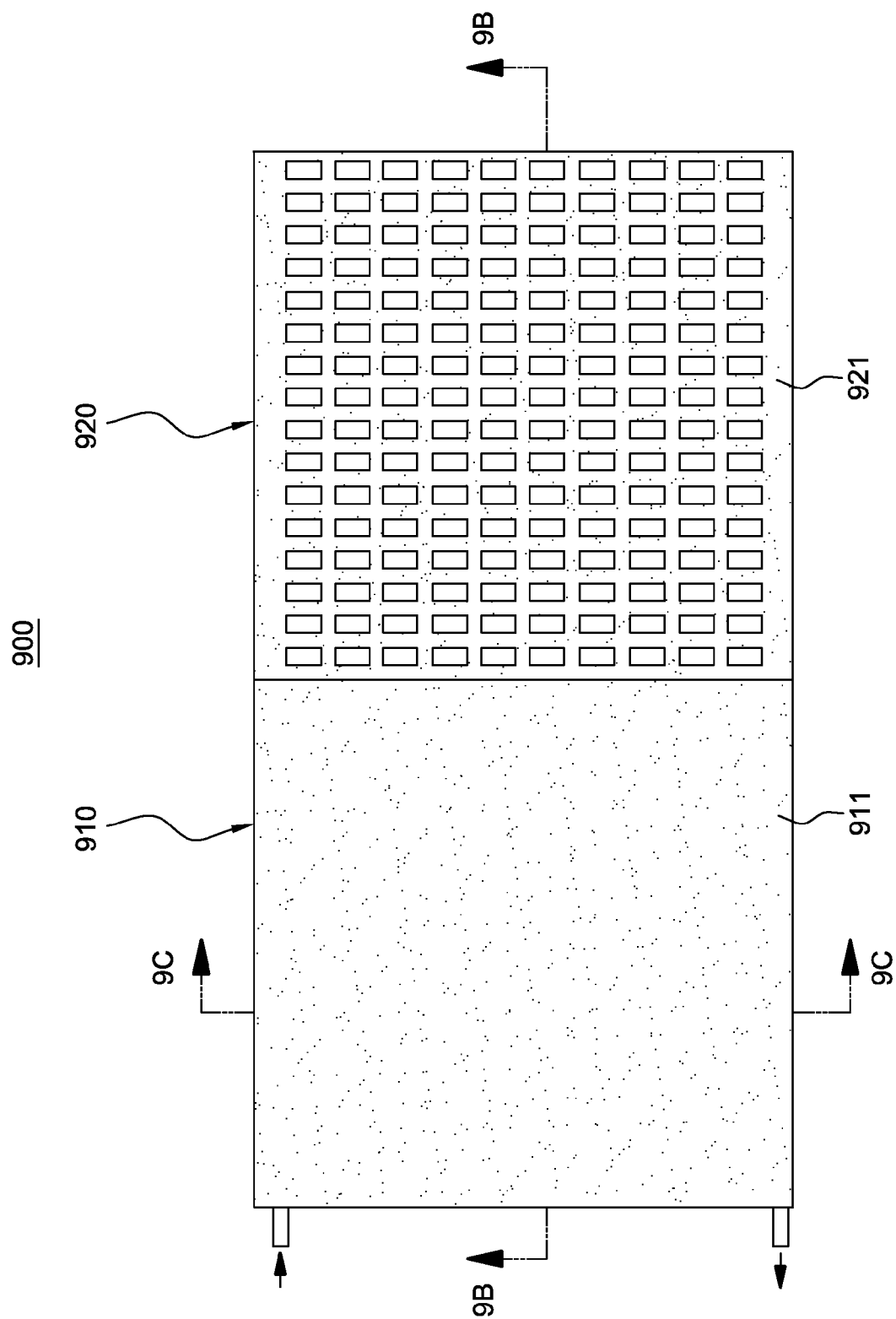

THERMOELECTRIC-ENHANCED, LIQUID-COOLING APPARATUS AND METHOD FOR FACILITATING DISSIPATION OF HEAT

BACKGROUND

The present invention relates to heat transfer mechanisms, and more particularly, to cooling apparatuses, liquid-cooled electronics racks and methods of fabrication thereof for removing heat generated by one or more electronic components of an electronics rack.

The power dissipation of integrated circuit chips, and the modules containing the chips, continues to increase in order to achieve increases in processor performance. This trend poses a cooling challenge at both the module and system levels. Increased airflow rates are needed to effectively cool higher power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device(s) or by increasing the rotational speed (i.e., RPMs) of an existing air moving device. However, this approach is becoming problematic at the rack level in the context of a data center.

BRIEF SUMMARY

In one aspect, the shortcomings of the prior art are overcome and additional advantages are provided through the provision of an apparatus for facilitating cooling of an electronics rack. The apparatus includes: a liquid-cooled structure, a coolant loop, a liquid-to-air heat exchanger, and a thermoelectric array. The liquid-cooled structure is coupled in thermal communication with the electronic component, and the coolant loop is in fluid communication with the a liquid-cooled structure, and includes a first loop portion and a second loop portion. The liquid-to-air heat exchanger is coupled in fluid communication with the liquid-cooled structure via the coolant loop, and receives coolant therefrom. The liquid-to-air heat exchanger cools coolant passing therethrough by dissipating heat from the coolant to air passing thereaross. The thermoelectric array is disposed with the first loop portion of the coolant loop at least partially in thermal contact with a first side thereof, and the second loop portion at least partially in thermal contact with a second side thereof, wherein the thermoelectric array operates to transfer heat from coolant passing through the first loop portion of the coolant loop to coolant passing through the second loop portion of the coolant loop. The thermoelectric array cools coolant passing through the first loop portion before the coolant passes through the liquid-cooled structure. Coolant passing through the first loop portion, after passing through the liquid-cooled structure, passes through the liquid-to-air heat exchanger for cooling thereof and coolant passing through the second loop portion, after receiving heat via the thermoelectric array, passes through the liquid-to-air heat exchanger for cooling thereof.

In another aspect, a cooled electronic system is provided, which includes: a plurality of electronic components to be cooled; and an apparatus facilitating dissipating heat from the plurality of electronic components to be cooled. The apparatus includes: a plurality of liquid-cooled structures, each liquid-cooled structure being coupled in thermal communication with a respective electronic component of the plurality of electronic components to be cooled; a coolant loop coupled in fluid communication with the plurality of liquid-cooled structures, the coolant loop comprising a plurality of first loop portions and a plurality of associated, second loop portions; a liquid-to-air heat exchanger coupled in fluid communication with the plurality of liquid-cooled structures via the coolant loop, and receiving coolant therefrom, the liquid-to-air heat exchanger cooling coolant passing therethrough by dissipating heat from the coolant to air passing thereacross; and a plurality of thermoelectric arrays, each thermoelectric array comprising at least one thermoelectric module, and each thermoelectric array being disposed with a first loop portion of the plurality of loop portions of the coolant loop at least partially in thermal contact with a first side thereof, and a second loop portion of the plurality of second loop portions of the coolant loop at least partially in thermal contact with a second side thereof, wherein the thermoelectric array operates to transfer heat from coolant passing through the first loop portion to coolant passing through the second loop portion, the thermoelectric array cooling coolant passing through the first loop portion before the coolant passes through a respective liquid-cooled structure of the plurality of liquid-cooled structures, and wherein the coolant passing through the first loop portion, after passing through the liquid-cooled structure, passes through the liquid-to-air heat exchanger for cooling thereof and the coolant passing through the second loop portion, after receiving heat via the thermoelectric array, passes through the liquid-to-air heat exchanger for cooling thereof.

In a further aspect, a method of facilitating cooling of an electronics rack is provided. The method includes: coupling in thermal communication a liquid-cooled structure with the electronic component; coupling in fluid communication a coolant loop with the liquid-cooled structure, the coolant loop comprising a first loop portion and a second loop portion; providing a liquid-to-air heat exchanger coupled in fluid communication with the liquid-cooled structure via the coolant loop, and receiving coolant therefrom, the liquid-to-air heat exchanger cooling coolant passing therethrough by dissipating heat from the coolant to air passing thereacross; and disposing a thermoelectric array, comprising at least one thermoelectric module, between the first loop portion and the second loop portion, with the first loop portion of the coolant loop at least partially being in thermal contact with a first side of the thermoelectric array and the second loop portion of the coolant loop at least partially being in thermal contact with a second side of the thermoelectric array, wherein the thermoelectric array operates to transfer heat from coolant passing through the first loop portion to coolant passing through the second loop portion, the thermoelectric array cooling coolant passing through the first loop portion before the coolant passes through the liquid-cooled structure, and wherein the coolant passing through the first loop portion, after passing through the liquid-cooled structure, passes through the liquid-to-air heat exchanger for cooling thereof and the coolant passing through the second loop portion, after receiving heat via the thermoelectric array, passes through the liquid-to-air heat exchanger for cooling thereof.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 7 is a cross-sectional elevational illustration of one embodiment of an electronics rack within a raised floor data center and another apparatus for facilitating cooling of one or more electronic components of the electronics rack, in accordance with an aspect of the present invention;

FIG. 8 is an isometric view of one embodiment of modular tile assemblies for an apparatus such as illustrated in FIG. 7, in accordance with an aspect of the present invention;

FIG. 9A is a plan view of one embodiment of two adjacent modular tile assemblies of an apparatus such as illustrated in FIG. 7, in accordance with an aspect of the present invention;

DETAILED DESCRIPTION

Figure 1:
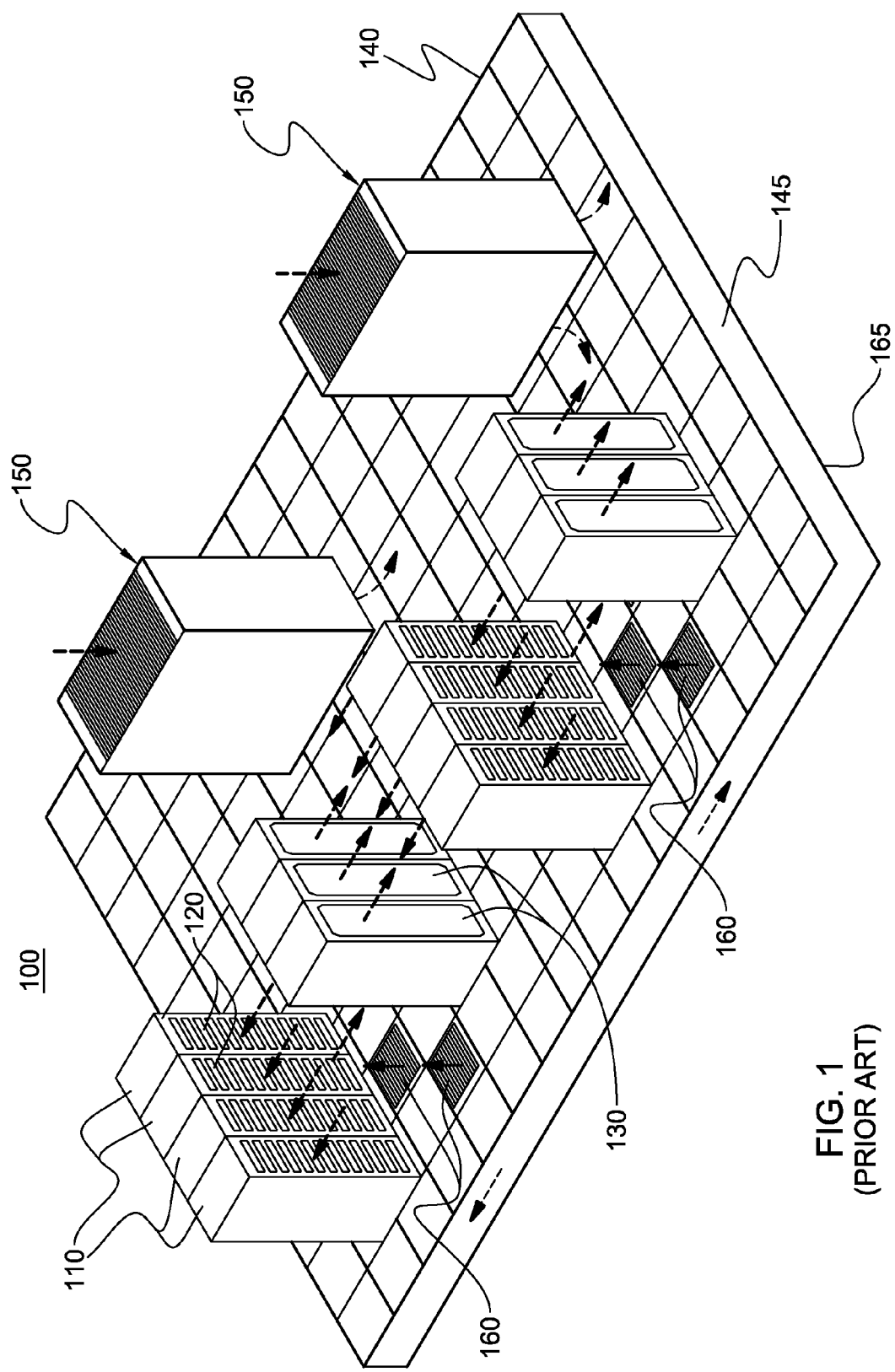
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand alone computer processor having high, mid or low end processing capability. In one embodiment, an electronics rack may comprise multiple electronic subsystems, each having one or more heat generating components disposed therein requiring cooling. "Electronic subsystem" refers to any sub-housing, blade, book, drawer, node, compartment, etc., having one or more heat generating electronic components disposed therein. Each electronic subsystem of an electronics rack may be movable or fixed relative to the electronics rack, with the rack-mounted electronic drawers of a multi-drawer rack unit and blades of a blade center system being two examples of subsystems of an electronics rack to be cooled.

"Electronic component" refers to any heat generating electronic component of, for example, a computer system or other electronic unit requiring cooling. By way of example, an electronic component may comprise one or more integrated circuit dies and/or other electronic devices to be cooled, including one or more processor dies, memory dies and memory support dies. As a further example, an electronic component may comprise one or more bare dies or one or more packaged dies disposed on a common carrier. As used herein, "primary heat generating component" refers to a primary heat generating electronic component within an electronic subsystem, while "secondary heat generating component" refers to an electronic component of the electronic subsystem generating less heat than the primary heat generating component to be cooled. Further, unless otherwise specified herein, the term "liquid-cooled cold plate" or "liquid-cooled structure" refers to any thermally conductive structure having one or more channels or passageways formed therein for flowing of liquid coolant therethrough. In addition, "metallurgically bonded" refers generally herein to two components being welded, brazed or soldered together by any means.

As used herein, "liquid-to-air heat exchanger" means any heat exchange mechanism characterized as described herein through which liquid coolant can circulate; and includes, one or more discrete liquid-to-air heat exchange mechanisms coupled either in series or in parallel. A liquid-to-air heat exchanger may comprise, for example, one or more coolant flow paths, formed of thermally conductive tubing (such as copper or other tubing) in thermal or mechanical contact with a plurality of air-cooled cooling fins. Size, configuration and construction of the liquid-to-air heat exchanger can vary without departing from the scope of the present invention. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of a liquid coolant (for example, the facility or system coolants discussed below) is water. However, the concepts disclosed herein are readily adapted to use with other types of coolant. For example, one or more of the coolants may comprise a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, cooled air enters the data center via perforated floor tiles 160 from a cool air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the data center. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of electronics racks 110.

Due to the ever-increasing airflow requirements through electronics racks, and the limits of air distribution within the typical data center installation, liquid-assisted cooling is being combined with the conventional air-cooling. FIGS. 2-6 illustrate one embodiment of a data center implementation employing a liquid-assisted cooling system with one or more cold plates coupled to high heat-generating electronic components disposed within the electronics racks.

Figure 2:
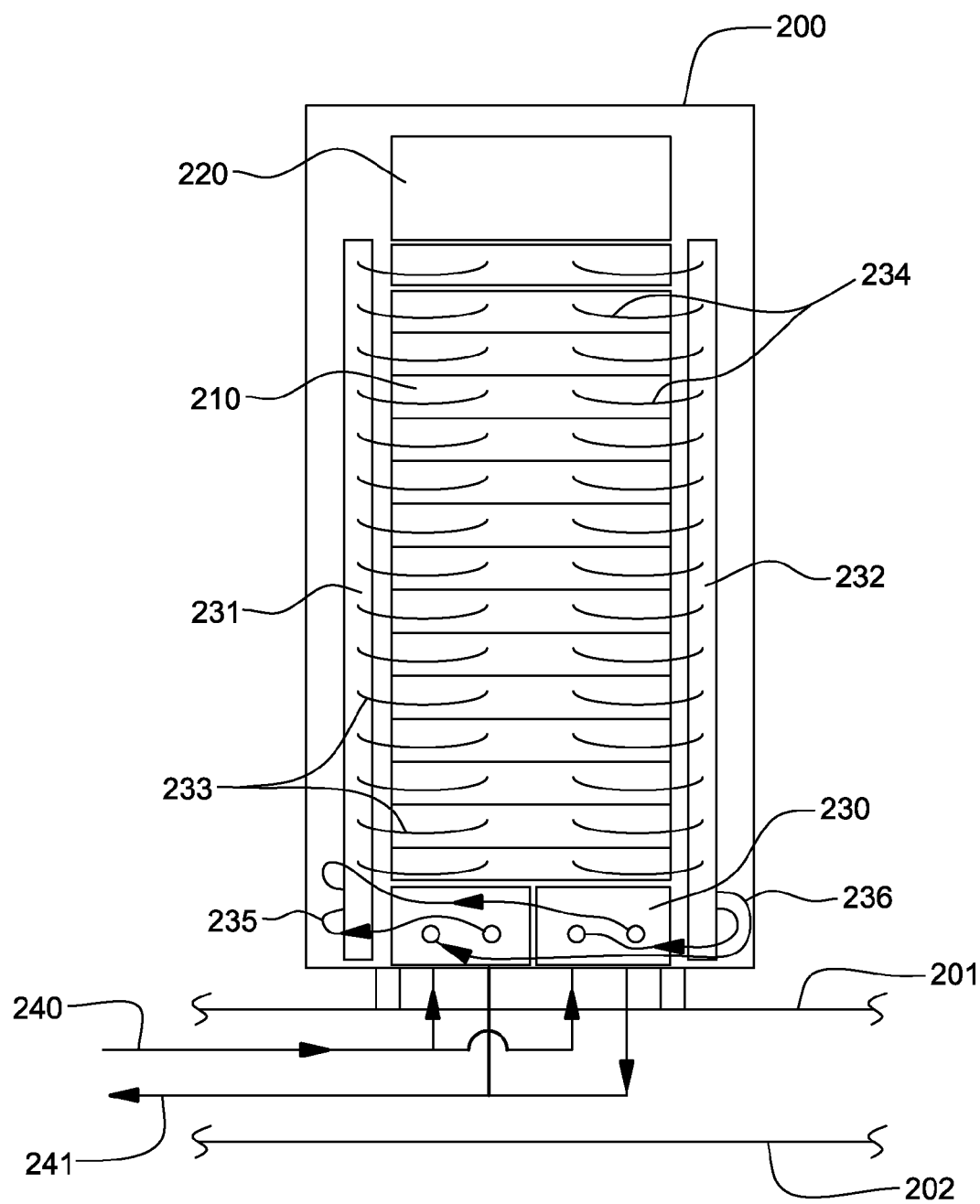
FIG. 2 is a front elevational view of one embodiment of an at least partially liquid-cooled electronics rack comprising multiple electronic subsystems, in accordance with one aspect of the present invention.

FIG. 2 depicts one embodiment of a partially liquid-cooled electronics rack 200. As illustrated, liquid-cooled electronics rack 200 comprises a plurality of electronic subsystems 210, which may be processor or server nodes. A bulk power regulator 220 is shown disposed at an upper portion of liquid-cooled electronics rack 200, and two coolant conditioning units (CCUs) 230 are disposed in a lower portion of the liquid-cooled electronics rack. In the embodiments described herein, the coolant is assumed to be water or an aqueous-based solution (by way of example only).

In addition to CCUs 230, the cooling system includes a system water supply manifold 231, a system water return manifold 232, and manifold-to-node fluid connect hoses 233 coupling system water supply manifold 231 to electronic subsystems 210, and node-to-manifold fluid connect hoses 234 coupling the individual electronic subsystems 210 to system water return manifold 232. Each CCU 230 is in fluid communication with system water supply manifold 231 via a respective system water supply hose 235, and each CCU 230 is in fluid communication with system water return manifold 232 via a respective system water return hose 236.

As illustrated, a portion of the heat load of the electronic subsystems is transferred from the system water to cooler facility water supplied by facility water supply line 240 and facility water return line 241 disposed, in the illustrated embodiment, in the space between a raised floor 201 and a base floor 202.

Figure 3:
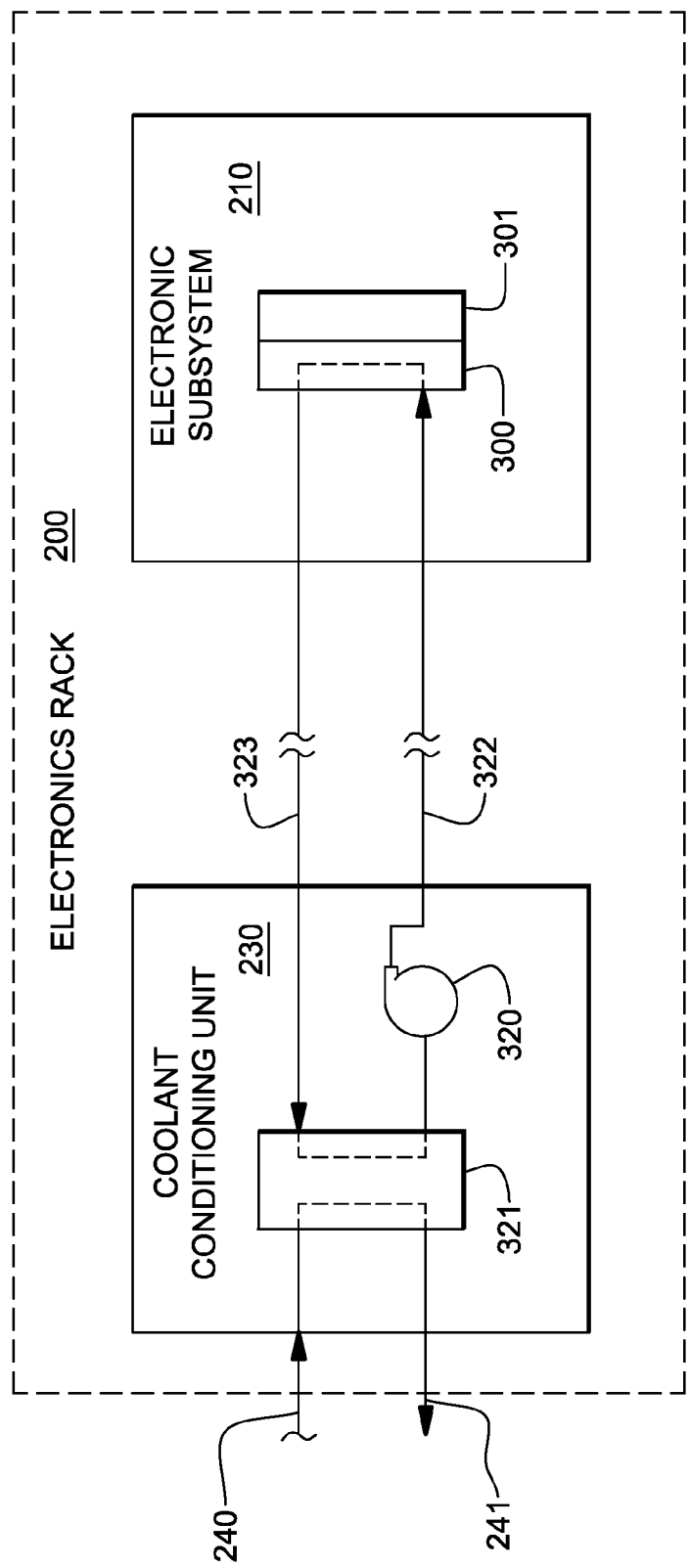
FIG. 3 is a schematic of one embodiment of an electronics rack, wherein an electronic module (or component) is liquid-cooled by system coolant (provided by one or more coolant conditioning units disposed within the electronics rack) passing through a liquid-cooled structure coupled to the electronic module, in accordance with an aspect of the present invention.

FIG. 3 schematically illustrates operation of the cooling system of FIG. 2, wherein a liquid-cooled cold plate 300 is shown coupled to an electronic module 301 of an electronic subsystem 210 within the liquid-cooled electronics rack 200. Heat is removed from electronic module 301 via the system coolant circulated via pump 320 through cold plate 300 within the system coolant loop defined by liquid-to-liquid heat exchanger 321 of coolant conditioning unit 230, lines 322, 323 and cold plate 300. The system coolant loop and coolant conditioning unit are designed to provide coolant of a controlled temperature and pressure, as well as controlled chemistry and cleanliness to the electronic module(s). Furthermore, the system coolant is physically separate from the less controlled facility coolant in lines 240, 241, to which heat is ultimately transferred.

Figure 4:
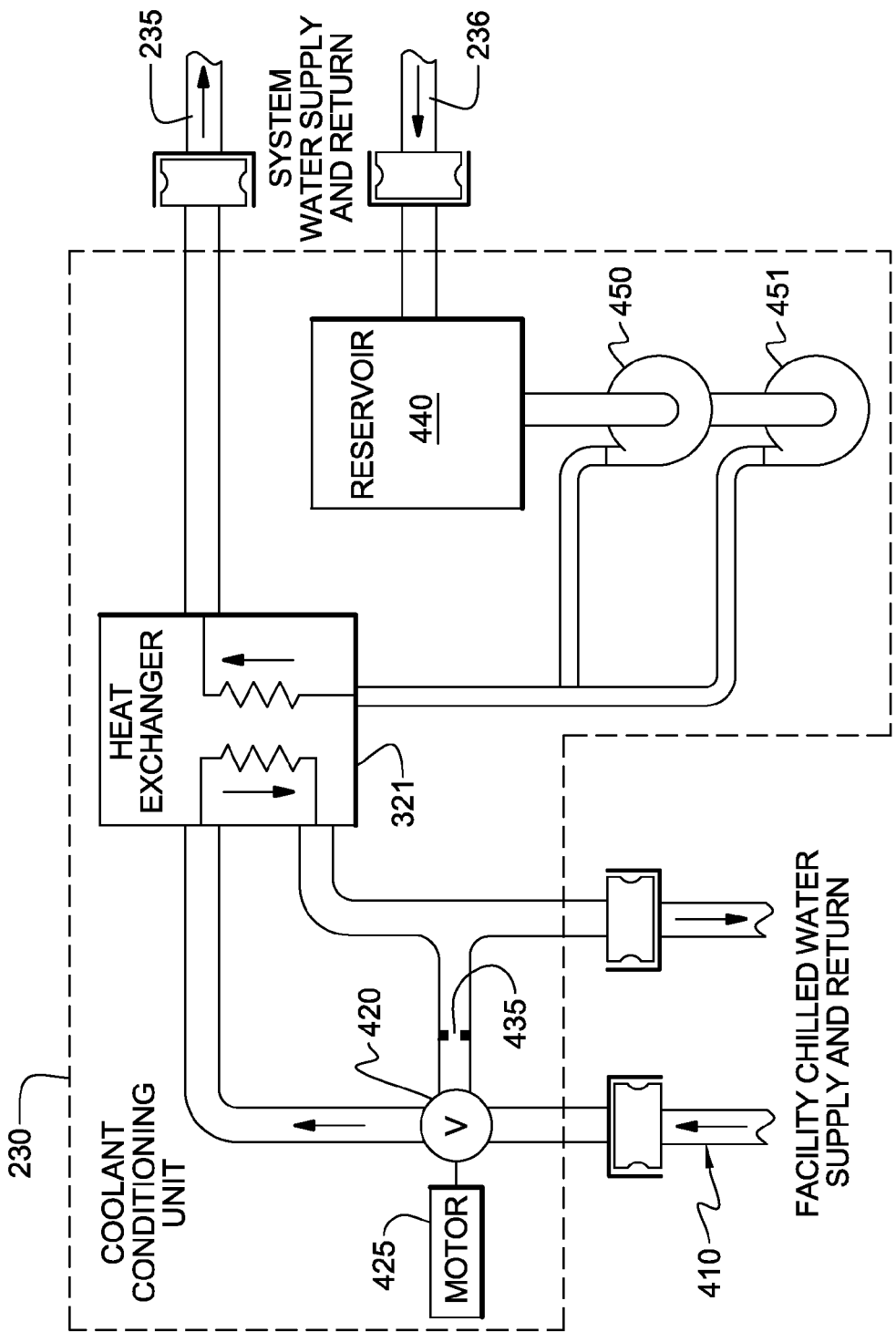
FIG. 4 is a schematic of one embodiment of a coolant conditioning unit disposed within a liquid-cooled electronics rack, in accordance with one aspect of the present invention.

FIG. 4 depicts a more detailed embodiment of a coolant conditioning unit 230. As shown in FIG. 4, coolant conditioning unit 230 includes a first cooling loop wherein building chilled, facility coolant is supplied 410 and passes through a control valve 420 driven by a motor 425. Valve 420 determines an amount of facility coolant to be passed through heat exchanger 321, with a portion of the facility coolant possibly being returned directly via a bypass orifice 435. The coolant conditioning unit further includes a second cooling loop with a reservoir tank 440 from which system coolant is pumped, either by pump 450 or pump 451, into the heat exchanger 321 for conditioning and output thereof, as cooled system coolant to the electronics rack to be cooled. The cooled system coolant is supplied to the system water supply manifold and system water return manifold of the liquid-cooled electronics rack via the system water supply hose 235 and system water return hose 236.

Figure 5:
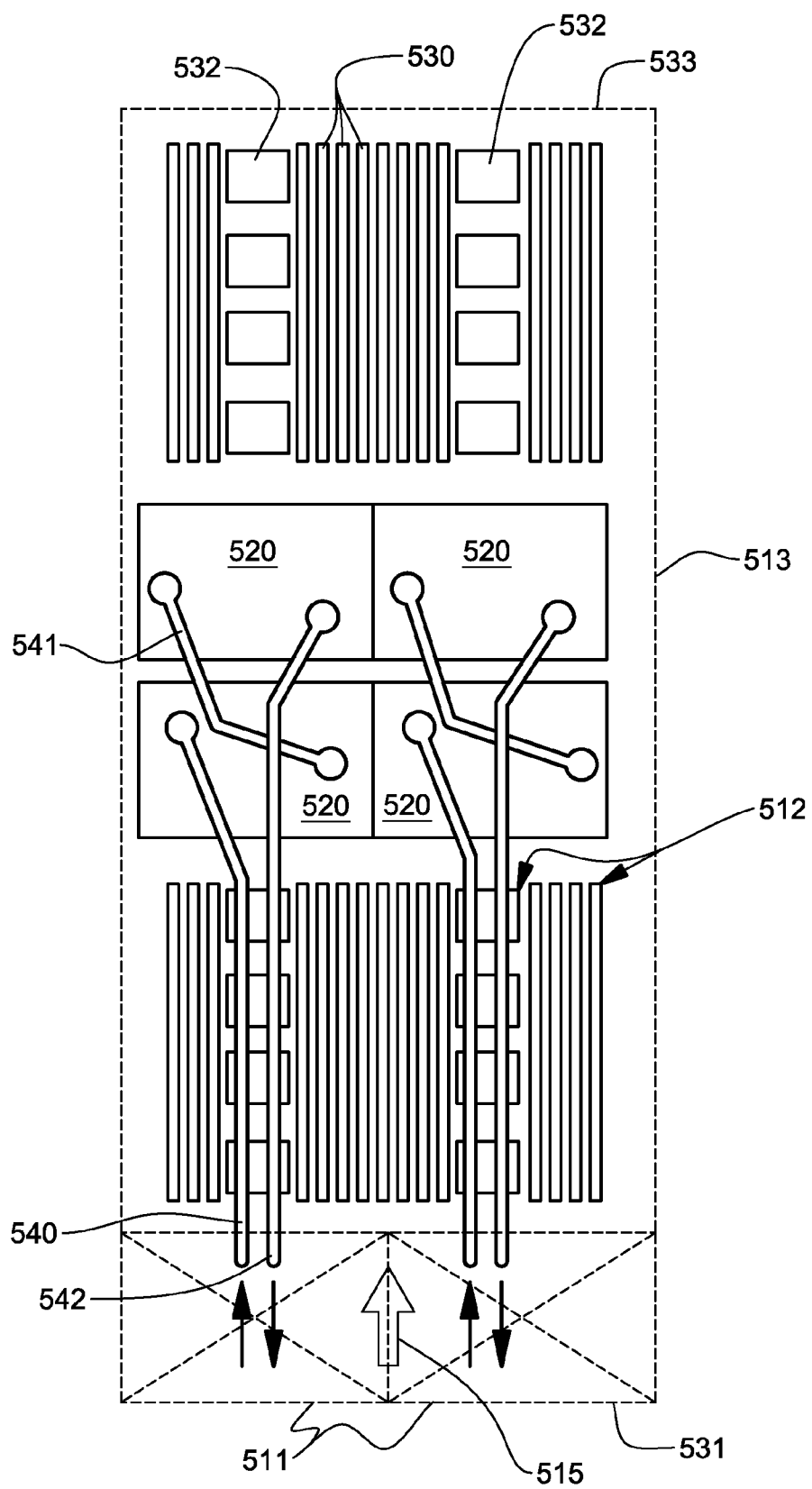
FIG. 5 is a plan view of one embodiment of an electronic subsystem layout illustrating an air and liquid cooling system for cooling components of the electronic subsystem, in accordance with an aspect of the present invention.

FIG. 5 depicts one embodiment of an electronic subsystem 513 component layout wherein one or more air moving devices 511 provide forced air flow 515 to cool multiple components 512 within electronic subsystem 513. Cool air is taken in through a front 531 and exhausted out a back 533 of the drawer. The multiple components to be cooled include multiple processor modules to which liquid-cooled cold plates 520 (of a liquid-based cooling system) are coupled, as well as multiple arrays of memory modules 530 (e.g., dual in-line memory modules (DIMMs)) and multiple rows of memory support modules 532 (e.g., DIMM control modules) to which air-cooled heat sinks are coupled. In the embodiment illustrated, memory modules 530 and the memory support modules 532 are partially arrayed near front 531 of electronic subsystem 513, and partially arrayed near back 533 of electronic subsystem 513. Also, in the embodiment of FIG. 5, memory modules 530 and the memory support modules 532 are cooled by air flow 515 across the electronic subsystem.

The illustrated liquid-based cooling system further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6:
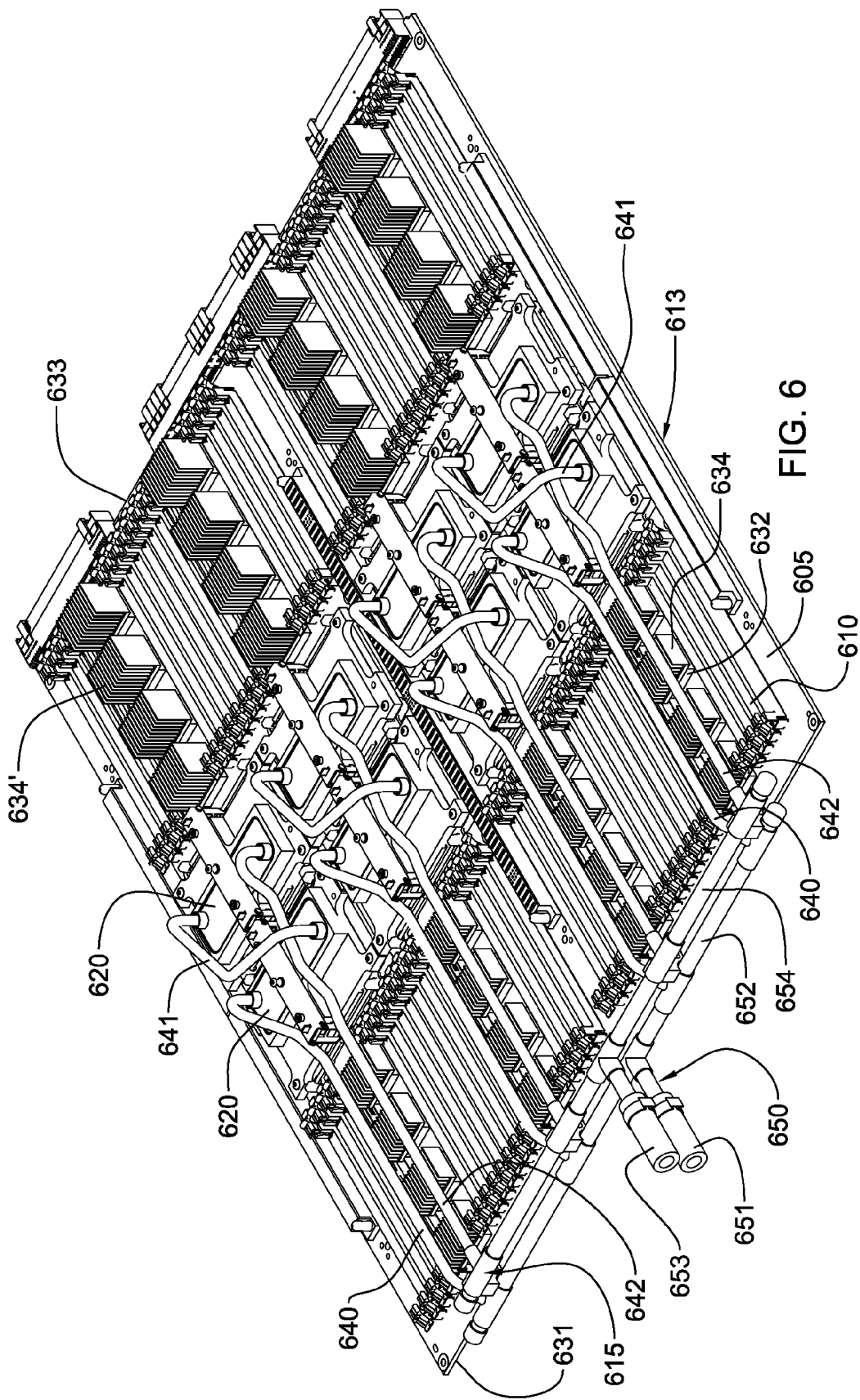
FIG. 6 depicts one detailed embodiment of a partially-assembled electronic subsystem layout, wherein the electronic subsystem includes eight heat-generating electronic components to be actively cooled, each having a respective liquid-cooled structure of a liquid-based cooling system coupled thereto, in accordance with an aspect of the present invention.

FIG. 6 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronic system, and thereby more effectively maintain the components at a desireable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronic system implementation. These more robust cooling systems have unique problems in their assembly and implementation. For example, one assembly solution is to utilize multiple fittings within the electronic system, and use flexible plastic or rubber tubing to connect headers, cold plates, pumps and other components. However, such a solution may not meet a given customer's specifications and need for reliability.

Thus, presented herein in one aspect is a robust and reliable liquid-assisted cooling system specially preconfigured and prefabricated as a monolithic structure for positioning within a particular electronics drawer.

FIG. 6 is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 6 depicts a partially assembled electronic system 613 and an assembled liquid-based cooling system 615 coupled to primary heat generating components (e.g., including processor dies) to be cooled. In this embodiment, the electronic system is configured for (or as) an electronics drawer of an electronics rack, and includes, by way of example, a support substrate or planar board 605, a plurality of memory module sockets 610 (with the memory modules (e.g., dual in-line memory modules) not shown), multiple rows of memory support modules 632 (each having coupled thereto an air-cooled heat sink 634), and multiple processor modules (not shown) disposed below the liquid-cooled cold plates 620 of the liquid-based cooling system 615.

In addition to liquid-cooled cold plates 620, liquid-based cooling system 615 includes multiple coolant-carrying tubes, including coolant supply tubes 640 and coolant return tubes 642 in fluid communication with respective liquid-cooled cold plates 620. The coolant-carrying tubes 640, 642 are also connected to a header (or manifold) subassembly 650 which facilitates distribution of liquid coolant to the coolant supply tubes and return of liquid coolant from the coolant return tubes 642. In this embodiment, the air-cooled heat sinks 634 coupled to memory support modules 632 closer to front 631 of electronics drawer 613 are shorter in height than the air-cooled heat sinks 634' coupled to memory support modules 632 near back 633 of electronics drawer 613. This size difference is to accommodate the coolant-carrying tubes 640, 642 since, in this embodiment, the header subassembly 650 is at the front 631 of the electronics drawer and the multiple liquid-cooled cold plates 620 are in the middle of the drawer.

Liquid-based cooling system 615 comprises a pre-configured monolithic structure which includes multiple (pre-assembled) liquid-cooled cold plates 620 configured and disposed in spaced relation to engage respective heat generating electronic components. Each liquid-cooled cold plate 620 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 620 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 6, header subassembly 650 includes two liquid manifolds, i.e., a coolant supply header 652 and a coolant return header 654, which in one embodiment, are coupled together via supporting brackets. In the monolithic cooling structure of FIG. 6, the coolant supply header 652 is metallurgically bonded in fluid communication to each coolant supply tube 640, while the coolant return header 654 is metallurgically bonded in fluid communication to each coolant return tube 652. A single coolant inlet 651 and a single coolant outlet 653 extend from the header subassembly for coupling to the electronics rack's coolant supply and return manifolds (not shown).

FIG. 6 also depicts one embodiment of the pre-configured, coolant-carrying tubes. In addition to coolant supply tubes 640 and coolant return tubes 642, bridge tubes or lines 641 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 640, bridge tubes 641 and coolant return tubes 642 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronic system to facilitate installation of the monolithic structure in engaging relation with the electronic system.

The above-described liquid cooling approach of FIGS. 2-6 is an effective solution for circulating water through liquid-cooled cold plates attached to heat-generating circuit modules (or components). An example of the efficacy of this approach is the IBM Power 575™ system offered by International Business Machines Corporation, Armonk, N.Y. In the embodiment of FIGS. 2-6, one or more coolant conditioning units containing a pump and, for example, a water-to-water heat exchanger, are disposed within each electronics rack. As explained above, heat load carried by the system coolant circulating through the liquid-cooled components in the liquid-cooled electronics rack is rejected to facility chilled water passing through the second coolant path through the active water-to-water heat exchangers within the coolant conditioning units disposed within the rack units.

Disclosed hereinbelow are alternative implementations of a hybrid, liquid-assisted, air-cooled electronics rack for a data center. These implementations may be advantageously employed in a data center lacking facility-chilled water.

FIG. 7 illustrates one embodiment of a raised floor data center 700, employing one or more liquid-cooled electronics racks 704, similar to those described above in connection with FIGS. 2-6, but without a coolant-conditioning unit disposed within the rack. Data center 700 is a raised floor data center, wherein a raised floor 701 is spaced above a base (or sub-floor) 702 of the room to define a cool air plenum 703. Although not shown, raised floor 701 is conventionally established via a plurality of struts extending vertically upwards from the base floor 702 to an interconnected grid support structure configured to receive floor tiles, which taken together, define raised floor 701. Within liquid-cooled electronics rack 704, a plurality of electronic subsystems 710 are shown by way of example. Electronic subsystems 710 are air-cooled, with cool air 707 being taken in through an air inlet side 705 of the rack unit, and exhausted as heated air 708 back into the data center through an air outlet side 706 thereof. One or more electronic components within the electronics rack, for example, within each electronic subsystem 710 of the electronics rack, are liquid-cooled to assist with extraction of heat from the electronics rack. For example, one or more primary heat-generating components 720 within one or more electronic subsystems 710 may have associated therewith liquid-cooled structures 730, such as liquid-cooled cold plates. Alternatively, liquid-cooled structures 730 might comprise discrete housings, each surrounding one or more electronic components to be cooled within the electronics rack for immersion-cooling of selected components within a dielectric coolant.

In the illustrated embodiment of FIG. 7, the liquid-cooling apparatus further includes a coolant supply manifold 732 supplying cooled liquid coolant in parallel (via a plurality of coolant supply lines 733) to multiple liquid-cooled structures 730. Heat extracted via liquid-cooled structures 730 from the one or more electronic components 720 is removed in parallel via respective coolant return lines 735 and a coolant return manifold 734. In this implementation, the supply and return manifolds 732, 734 are vertically-oriented and couple via quick connects 741, 742, respectively, to a first modular tile assembly 740 which defines, in part, the cool air plenum 703. As shown, a pump 744 and a coolant reservoir 745 are provided as part of first modular tile assembly 740. In one implementation, these structures are part of the modular tile assembly such that removal of the modular tile assembly 740 from the raised floor structure 701 results in removal of the pump and reservoir as well. For example, the pump and reservoir may be affixed to a solid surface tile of the modular tile assembly 740. Modular tile assembly 740 further includes coolant lines which facilitate defining a coolant loop 737 between liquid-cooled structures 730 and a liquid-to-air heat exchanger 752 associated with a second modular tile assembly 750. Fluid connection between the coolant lines of first modular tile assembly 740 and liquid-to-air heat exchanger 752 of second modular tile assembly 750 is facilitated via respective quick connects 747, 748. By way of example, the quick connects or quick connect couplings 741, 742, 747, 748 may comprise any one of various types of commercially available quick connect couplings, such as those available from Colder Products, Company, of St. Paul, Minn., U.S.A., or Parker Hannifin, of Cleveland, Ohio, U.S.A.

In one implementation, first modular tile assembly 740 and second modular tile assembly 750 are adjacent to each other within the raised floor 701, with the pump and reservoir (in the case of the first modular tile assembly 740) and the liquid-to-air heat exchanger 752 (in the case of the second modular tile assembly 750) disposed below and extending away from respective solid surface tiles of the respective assemblies into cool air plenum 703.

In operation, cool air 763 within cool air plenum 703 passes across liquid-to-air heat exchanger 752, which cools the coolant passing therethrough by dissipating heat from the coolant passing through the heat exchanger to the cooled air passing thereacross. In this manner, heated coolant within coolant loop 737 is cooled by the air passing across the liquid-to-air heat exchanger 752. The modularity of the modular tile assemblies allows for individual removal and servicing of, for example, the first modular tile assembly 740 or the second modular tile assembly 750, with the appropriate quick connects 741, 742, 747 or 748 being employed to readily open (or complete) the coolant loop, as required.

The embodiment illustrated in FIG. 7 also comprises a third modular tile assembly 760, which includes an air-moving device 762, and one or more baffles 754 configured to facilitate directing airflow passing across liquid-to-air heat exchanger 752 of second modular tile assembly 750 through a perforated tile 761 of third modular tile assembly 760 back into data center 700 as exhaust air 765. In the illustrated implementation, this exhaust air 765 egresses into a hot air aisle of the data center at the air outlet side 706 of electronics rack 704. Although not illustrated, baffling 754 may extend to wrap around third modular tile assembly 760 and to project outward to mate with second modular tile assembly 750 to form a substantially closed airflow path to direct air passing across the liquid-to-air heat exchanger 752 towards the perforated tile 761.

In FIG. 8, the three modular tile assemblies 740, 750 & 760 illustrated in FIG. 7 are represented in simplified isometric view, by way of example only. As shown, first and second modular tile assemblies 740, 750 include solid surface tiles 800, 801, respectively, while third modular tile assembly 760 includes perforated tile 761 for allowing exhaust air to egress into the data center, for example, at a hot air aisle of the data center.

As one detailed example, the electronic component 720 described above may comprise one or more multichip processor modules, and the coolant being employed within the cooling apparatus can be water. Further, the liquid-cooled structure 730 may comprise a liquid-cooled cold plate. Advantageously, cool air within cool air plenum 703 is at a significantly lower temperature than the ambient air within the data center, and facilitates cooling of the coolant passing through the liquid-to-air heat exchanger 752. The modularized tile assembly approach depicted in the figures and described above advantageously facilitates servicing of the cooling apparatus, as well as integration of the apparatus into the data center, for example, in the vicinity of an electronics rack to be cooled. Should more heat exchangers or more air-moving devices be desired, then they can be readily configured for addition into the modularized cooling apparatus for a particular implementation. For example, two modular tile assemblies 750 could be coupled in parallel (or even in series) to provide additional cooling capacity. The apparatus described herein results in a hybrid cooling of the electronics rack, wherein airflow continues to provide cooling to many of the electronic components of the electronics rack, and the liquid-cooling apparatus facilitates extracting heat from certain higher (or primary) heat-generating electronic components within the electronics rack, such as processors within one or more of the individual electronic subsystems. The special modular tile assemblies described herein may be readily integrated into a raised floor structure, with the quick connect couplings employed for ready removal or replacement of one or more of the modular tile assemblies.

Figure 9B:
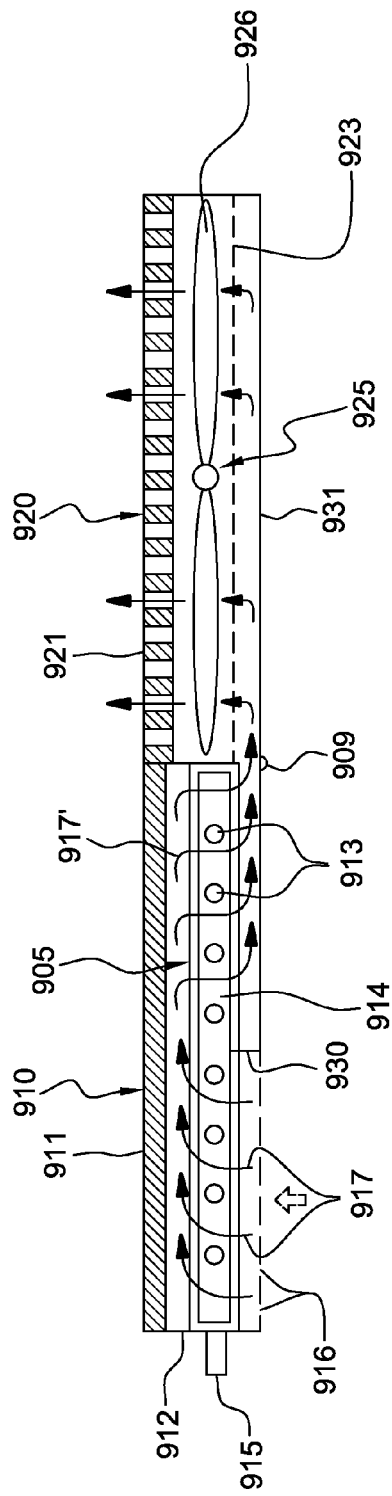
FIG. 9B is a cross-sectional elevational view of the two adjacent modular tile assemblies of FIG. 9A, taken along line 9B-9B thereof, in accordance with an aspect of the present invention.
Figure 9C:
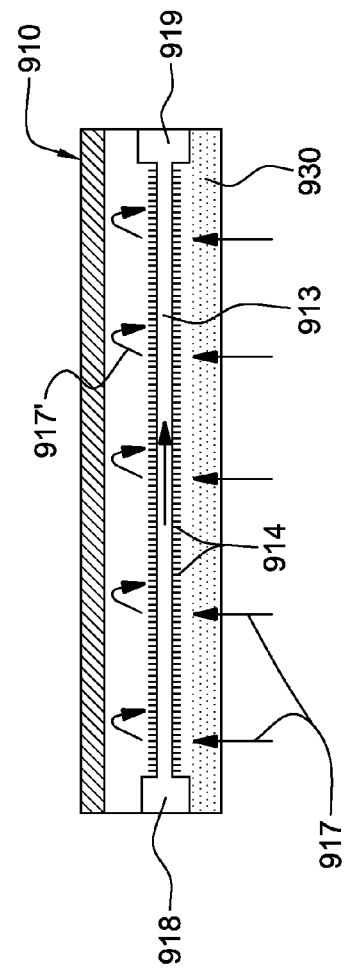
FIG. 9C is a cross-sectional elevational view of the two adjacent modular tile assemblies of FIG. 9A, taken along line 9C-9C thereof, in accordance with an aspect of the present invention.

FIGS. 9A-9C depict a more detailed implementation of one embodiment of a modular, tile-based heat exchange assembly 910 and a modular, tile-based air-moving device assembly disposed adjacent to each other, for example, within a raised floor of a raised floor data center 900.

As illustrated in FIGS. 9A-9C, modular tile-based heat exchange assembly 910 includes a solid surface tile 911 and a frame (or housing) 912 which supports a liquid-to-air heat exchanger 905 substantially in parallel with solid surface tile 911. Liquid-to-air heat exchanger 905 includes a plurality of coolant-carrying channels (or tubes) 913 between which a plurality of thermally conductive fins 914 extend. The plurality of coolant-carrying tubes 913 are in fluid communication at opposite ends with a coolant supply manifold 918 and a coolant return manifold 919. Coolant supply manifold 918 is, in one embodiment, coupled to a coolant inlet tube 915, and coolant return manifold 919 is coupled to a coolant outlet tube (not shown). In one example, these tubes facilitate coupling liquid-to-air heat exchanger 905 in fluid communication with the coolant loop 737 (FIG. 7). Cool air 917 within the cool air plenum is taken in through openings 916 in housing 912 and is turned 917' within the housing after passing across, for example, half of the liquid-to-air heat exchanger 905 to pass over the other half of the liquid-to-air heat exchanger 905. Appropriate air baffling 930 is provided to direct the exhaust air to the modular, tile-based air-moving device assembly 920. One or more gaskets 909 can be provided between the assemblies 910 & 920 to facilitate sealing the assemblies together and directing the exhaust air towards the modular, tile-based air-moving device assembly 920.

Assembly 920 included a perforated tile 921 and an air-moving device 925 oriented with the blades 926 thereof extending in a plane substantially parallel to perforated tile 921. A screen 923 is provided enclosing air-moving device 925. Note that, depending upon the implementation, one (or more than one) air-moving device(s) may be incorporated into a single modular, tile-based air-moving device assembly 920. Appropriate baffling 931 is provided to facilitate directing of the exhaust air from modular, tile-based heat exchange assembly 910 towards air-moving device 925.

Figure 10:
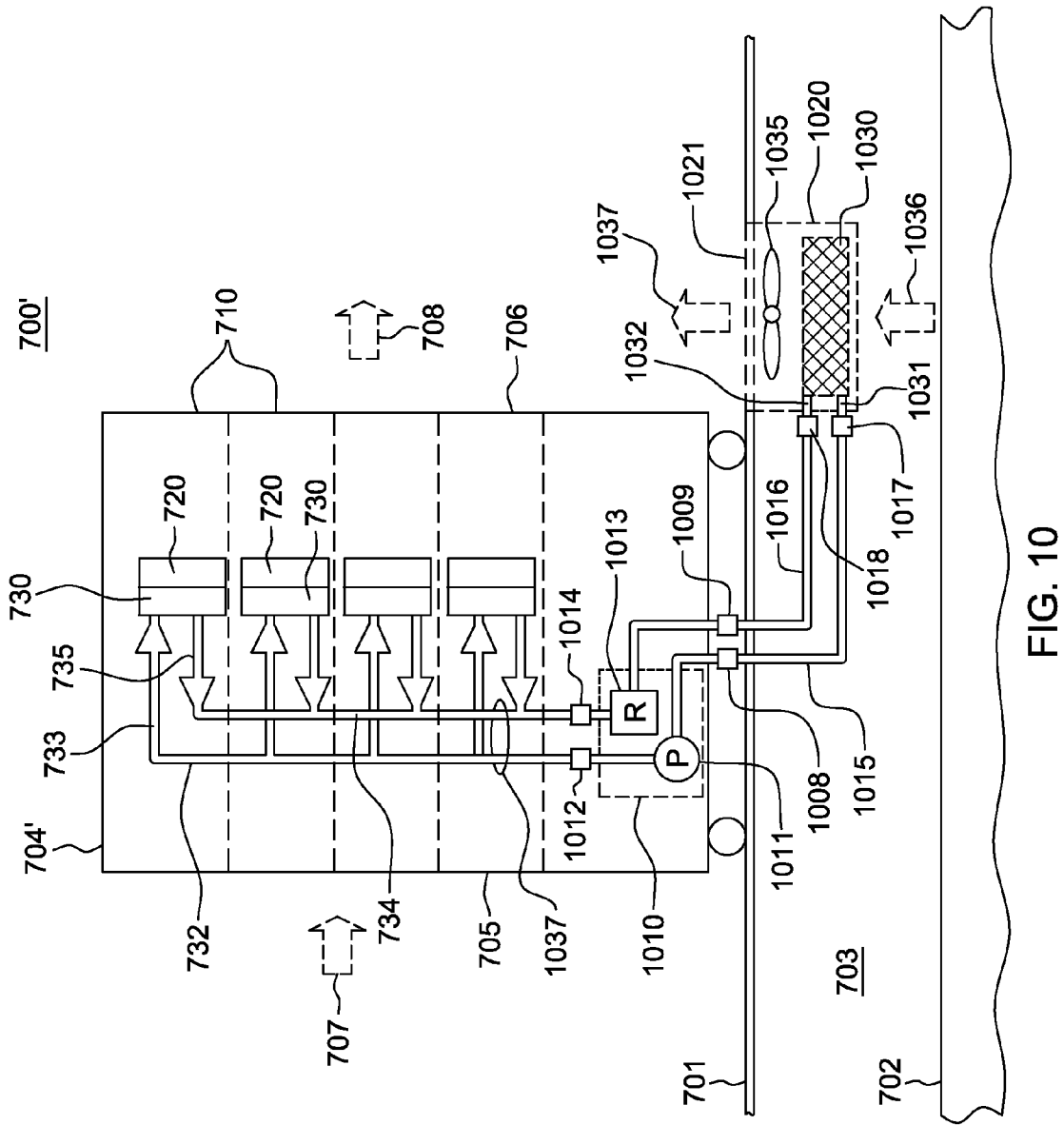
FIG. 10 is a cross-sectional elevational illustration of an alternate embodiment of an electronics rack within a raised floor data center and an apparatus for facilitating cooling of one or more electronic components of the electronics rack, in accordance with an aspect of the present invention.

FIG. 10 illustrates an alternate implementation of the cooling apparatus of FIGS. 7-9C. In this implementation, a single modular tile assembly 1020 is provided which defines, in part, cool air plenum 703 of air-cooled data center 700', and a coolant pumping unit 1010, comprising a coolant pump 1011 and a reservoir 1013 in fluid communication with a coolant loop 1037, and disposed in a lower portion of electronics rack 704'. Integration of coolant pumping unit 1010 within electronics rack 704' advantageously minimizes external setup of the cooling apparatus. In the embodiment illustrated, quick connects 1012 and 1014 respectively couple in fluid communication coolant supply manifold 732 and coolant return manifold 734 with coolant pump 1011 and reservoir 1013. Additional liquid coolant lines 1015 and 1016 couple via respective quick connects 1008, 1017, 1018 and 1009, coolant pumping unit 1010 and the modular tile assembly 1020, and in particular, respective coolant inlet and coolant outlet lines 1031, 1032 of liquid-to-air heat exchanger 1030 thereof. As shown, in operation, cool air 1036 within the cool air plenum 703 is drawn across liquid-to-air heat exchanger 1030 of modular tile assembly 1020 via air-moving device 1035 and exhausted as heated air 1037 through the perforated tile 1021 of the modular tile assembly 1020 into, for example, a hot air aisle of data center 700'.

By way of further enhancement to the cooling apparatuses depicted in FIGS. 7-10, described below are various thermoelectric-enhanced, liquid-cooling apparatuses. The implementations described below utilize a thermoelectric-enhanced, liquid-to-liquid heat exchange assembly to, for example, provide cooler water to a liquid-cooled structure in thermal communication with an electronic component to be cooled than can be achieved using a hybrid liquid-to-air heat exchange loop alone, while still rejecting the heat load from the electronic component to ambient room air. The use of thermoelectric cooling elements to electronically produce a cooling effect is known in the art, as represented by U.S. Pat. No. 6,557,354 B1, wherein the use of thermoelectric elements to facilitate the transfer of heat from, for example, a coolant, such as a water stream, to a warmer air stream is described.

Thermoelectric-enhanced cooling provides a number of advantages. For example, thermoelectric cooling devices can be used to produce temperatures below ambient, and their heat pumping capability is readily adjustable up or down by varying the electric current passing through the thermoelectric array. In general, a thermoelectric array's maximum heat pumping capability is proportional to the number of thermoelectric couples used, so the array can be readily scaled and modularized from small to large, depending on the cooling assembly required. Since thermoelectric arrays operate electrically with no moving parts, they are essentially maintenance free and offer high reliability. Although reliability may be somewhat application-dependent, the lifespan of a typical thermoelectric element cooler (TEC) is greater than 200,000 hours. Unlike other cooling approaches, a thermoelectric module generates virtually no electrical noise and is acoustically silent. Thermoelectric devices are also "friendly" to the environment, since they do not require the use of refrigerants or other gases.

Figure 11:
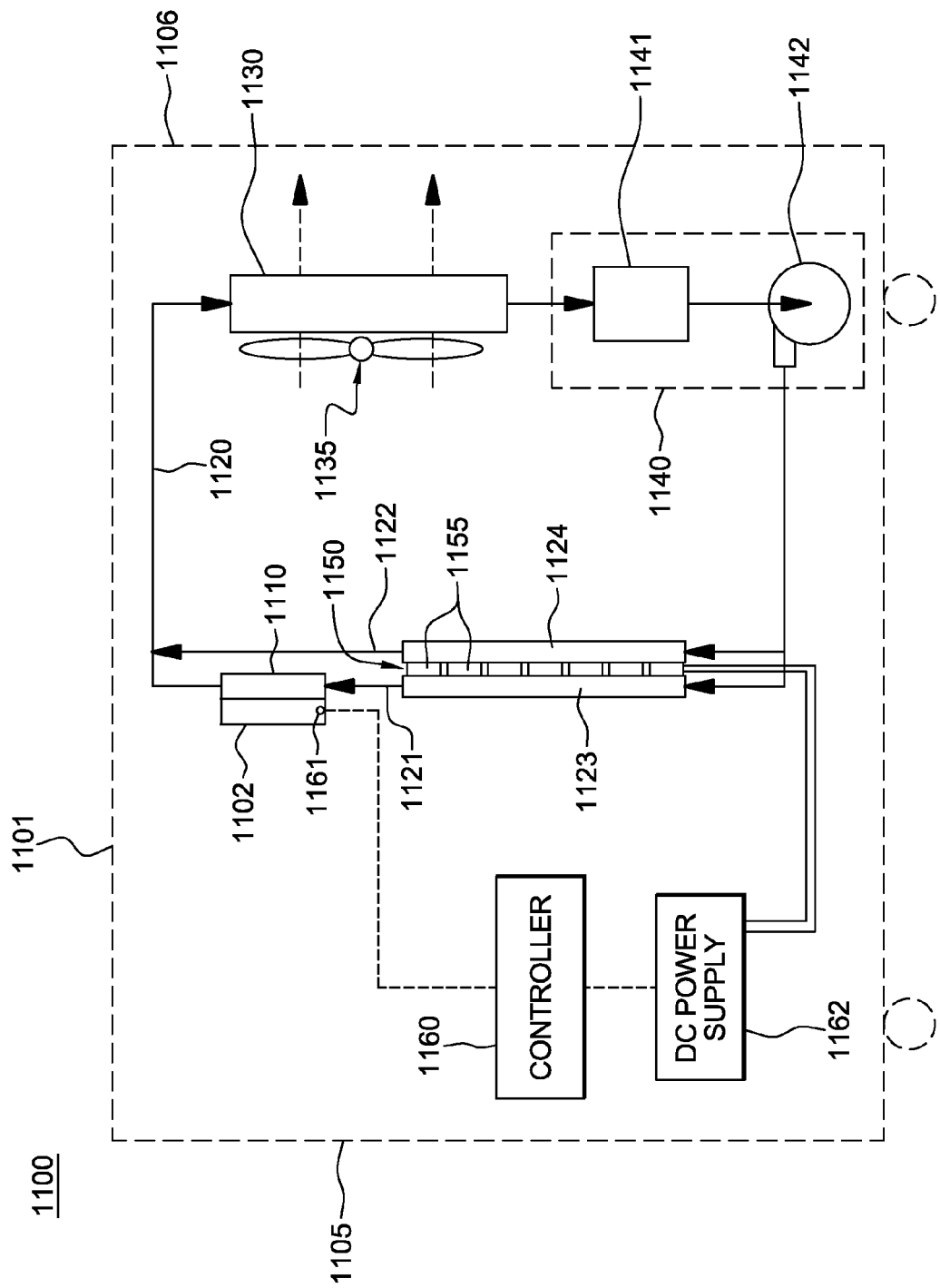
FIG. 11 is a schematic illustration of one embodiment of an electronics rack and a thermoelectric-enhanced, liquid-cooling apparatus for facilitating cooling of one or more electronic components of the electronics rack, in accordance with an aspect of the present invention.

FIG. 11 depicts one embodiment of a cooled electronic system 1100 comprising an electronics rack 1101 and a thermoelectric-enhanced, liquid-cooling apparatus, in accordance with an aspect of the present invention. In this example, electronics rack 1101 is shown to include one or more electronic components 1102 to be cooled. As with the examples described above, the electronic component(s) may be disposed in one or more electronic subsystems of the electronics rack 1101. Note that one electronic component is illustrated in the example of FIG. 11 by way of example only. Electronics rack 1101 includes an air inlet side 1105 and an air outlet side 1106, wherein airflow through the rack provides cooling to one or more components within the rack.

As illustrated, the thermoelectric-enhanced, liquid-cooling apparatus includes a liquid-cooled structure 1110 in thermal communication with the electronic component 1102. Liquid-cooled structure 1110 is coupled in fluid communication with a coolant loop 1120, which includes a first loop portion 1121 and a second loop portion 1122 shown, in this example, in parallel fluid communication within coolant loop 1120, with liquid-cooled structure 1110 coupled in fluid communication in first loop portion 1121 to receive coolant passing therethrough. In operation, coolant passing through liquid-cooled structure 1110 removes at least a portion of the heat being generated by electronic component 1102.

In the embodiment of FIG. 11, coolant passing through first loop portion 1121 and second loop portion 1122 flows together through a liquid-to-air heat exchanger 1130, which dissipates heat from the heated coolant to air passing thereacross. Airflow across liquid-to-air heat exchanger 1130 is facilitated by one or more air-moving devices 1135 disposed, for example, within the electronics rack. Coolant egressing from liquid-to-air heat exchanger 1130 is circulated back through coolant loop 1120 via a coolant pumping unit 1140, which includes, in one embodiment, a coolant reservoir (or expansion tank) 1141 and a coolant pump 1142. As illustrated in FIG. 11, cooled coolant egressing from liquid-to-air heat exchanger 1130 is pumped in parallel through both first loop portion 1121 and second loop portion 1122, which in the illustrated example, respectively comprise first and second coolant branches of coolant loop 1120.

A thermoelectric-enhanced, liquid-to-liquid heat exchange assembly 1150 is coupled between the first and second coolant branches. As illustrated, thermoelectric-enhanced, liquid-to-liquid heat exchange assembly 1150 includes a first liquid-heat exchange element 1123 and a second liquid-heat exchange element 1124, each of which is in fluid communication with the respective first coolant branch or second coolant branch of the coolant loop. As explained below, the thermoelectric array comprises, in one embodiment, multiple thermoelectric modules 1155 disposed between the first and second coolant branches, with the first liquid-heat exchange element 1123 of the first loop portion 1121 in thermal contact with a first side thereof and the second liquid-heat exchange element 1124 of the second loop portion 1122 in thermal contact with a second side thereof. Heat exchange assembly 1150 operates to transfer heat from coolant passing through the first loop portion to coolant passing through the second loop portion. In the configuration illustrated, the thermoelectric array cools coolant passing through the first loop portion 1121 before the coolant passes through liquid-cooled structure 1110.

Figure 12:
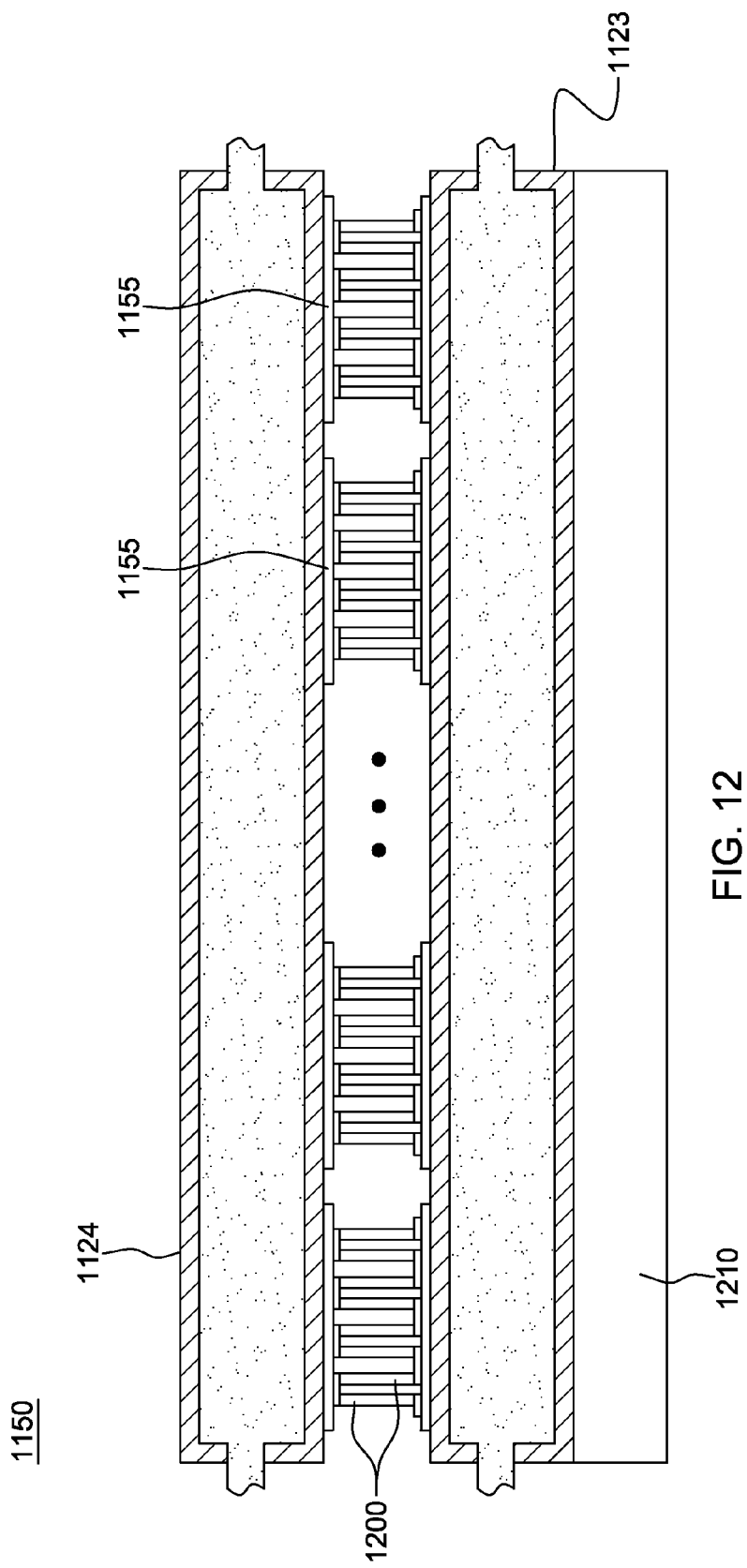
FIG. 12 is a cross-sectional elevational view of one embodiment of a thermoelectric-enhanced, liquid-to-liquid heat exchange assembly for the thermoelectric-enhanced, liquid-cooling apparatus of FIG. 11, in accordance with an aspect of the present invention.

FIG. 12 is a cross-sectional elevational view of one embodiment of a thermoelectric-enhanced, liquid-to-liquid heat exchange assembly 1150, in accordance with an aspect of the present invention. In this example, first liquid-heat exchange element 1123 is, as one example, a liquid-cooled cold plate, and second liquid-heat exchange element 1124 is a second liquid-cooled cold plate, wherein coolant through the first and second coolant branches ingresses and egresses through the respective cold plate. The thermoelectric array comprises, in this example, a plurality of thermoelectric modules 1155, each of which comprises individual thermoelectric elements 1200.

The use of large thermoelectric cooling elements is known. These elements operate electronically to produce a cooling effect. By passing a direct current through the legs of a thermoelectric device, a temperature difference is produced across the device which may be contrary to that which would be expected from Fourier's law.

At one junction of the thermoelectric element, both holes and electrons move away, towards the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (e.g., air or water). When direct current is passed through the thermoelectric modules, a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the thermoelectric module.

By way of specific example, thermoelectric modules 1155 may comprise TEC CP-2-127-06L modules, offered by Melcor Laird, of Cleveland, Ohio.

Note that the thermoelectric array may comprise any number of thermoelectric modules, including one or more modules, and is dependent (in part) on the size of the electronic modules, as well as the amount of heat to be transferred from coolant flowing through first liquid-heat exchange element 1123 to coolant flowing through second liquid-heat exchange element 1124. An insulative material 1210 is provided, in this example, over one or more of the exposed surfaces of first liquid-heat exchange element 1123. As noted above, coolant within first liquid-heat exchange element 1123 may be cooled to a temperature below ambient temperature just prior to passing through liquid-cooled structure 1110 (FIG. 11).

The thermoelectric (TE) array may comprise a planar thermoelectric array with modules arranged in a square or rectangular array. Although the wiring is not shown, each thermoelectric module in a column may be wired and supplied electric current (I) in series and the columns of thermoelectric modules may be electrically wired in parallel so that the total current supplied would be I×sqrt(M), providing an appreciation of the inherent scalability of the array. In this way, if a single thermoelectric module should fail, only one column is effected, and electric current to the remaining columns may be increased to compensate for the failure.

Table 1 provides an example of the scalability provided by a planar thermoelectric heat exchanger configuration such as described herein.

TABLE 1

| Number of TE Modules (M) | Heat Exchanger Size |
|---|---|
| 81 | 585 mm × 585 mm (23.0 in. × 23.0 in.) |
| 100 | 650 mm × 650 mm (25.6 in. × 25.6 in.) |
| 121 | 715 mm × 715 mm (28.2 in. × 28.2 in.) |
| 144 | 780 mm × 780 mm (30.7 in. × 30.7 in.) |
| 169 | 845 mm × 845 mm (33.3 in. × 33.3 in.) |

For a fixed electric current and temperature difference across the thermoelectric modules, the heat pump (i.e., thermoelectric array) will scale with the number of thermoelectric modules in the platform area. Thus, the heat load capability of a 650 mm×650 mm thermoelectric heat exchanger will be 1.23 times that of a 585 mm×585 mm thermoelectric heat exchanger, and that of an 845 mm×845 mm will be 2.09 times greater. Note that the size of the liquid-to-air heat exchanger may need to grow to accommodate the increased heat load. If the space available for the thermoelectric heat exchanger is constrained in the X×Y dimensions, then the heat pumping capabilities can still be scaled upwards by growing in the Z dimension. This can be done by utilizing multiple layers of thermoelectric modules between multiple cold plates, with alternating hot and cold sides, as described in the above-referenced U.S. Pat. No. 6,557,354 B1.

Note that in the example of FIG. 11, only one coolant loop 1120 and one coolant pump 1142 are advantageously employed. Cooled coolant leaving the liquid-to-air heat exchanger 1130 is delivered in parallel to both the first liquid-heat exchange element 1123 attached to the cold side of the thermoelectric array (i.e., left side of the array in FIG. 11), and the second liquid-heat exchange element 1124 attached to the hot side of the thermoelectric array (i.e., right side of the array in FIG. 11). Coolant flowing through the first liquid-heat exchange element 1123 is thus further cooled by the thermoelectric modules before entering the liquid-cooled structure 1110 in thermal communication with the electronic component 1102 for extracting heat from the electronic component. The coolant flowing through the second liquid-heat exchange element 1124 receives heat pumped by the thermoelectric elements plus heat from the power dissipated by the thermoelectric elements. The cold side and hot side coolant streams subsequently join together and mix to return to the liquid-to-air heat exchanger 1130, where the combined heat load is rejected to the ambient air.

As illustrated in FIG. 11, a controller 1160 is provided coupled in communication with one or more temperature sensors 1161. Temperature sensor(s) 1161 is in thermal communication with the electronic component to be cooled, for example, being mounted to a casing of the component. Controller 1160 controls the electric current supplied by a DC power supply 1162 to thermoelectric modules 1155 of the thermoelectric array. For example, if electronic component temperature increases, as might happen if the electronic component power increases or ambient air temperature increases, current to the thermoelectric modules 1155 is increased, resulting in increased heat pumping by the thermoelectric-enhanced, liquid-to-liquid heat exchange assembly, and the delivery of cooler coolant (e.g., water) to liquid-cooled structure 1110. If component temperature decreases, as might happen if component power decreases or ambient air temperature decreases, current to thermoelectric modules 1155 is decreased, resulting in a decreased heat pumping by the thermoelectric-enhanced, liquid-to-liquid heat exchange assembly 1150 and the delivery of warmer coolant to liquid-cooled structure 1110.

In the event of failure of the DC power supply 1162 providing electric current to the thermoelectric modules 1155, the controller could put the computer system into a "cycle steering" mode as described, for example, in an article by J. G. Torok et al., entitled "Packaging Design of the IBM System z10 Enterprise Class Platform Central Electronic Complex", IBM Journal of Research and Development, Vol. 53, No. 1, Paper 9 (2009). In this mode, the electronic component's (e.g., processor) frequency and voltage is reduced, thereby reducing power dissipation by the electronic component, making it possible to effectively cool the component with the cooling apparatus operating as a liquid-to-air hybrid cooling system, without thermoelectric array augmentation.

Figure 13:
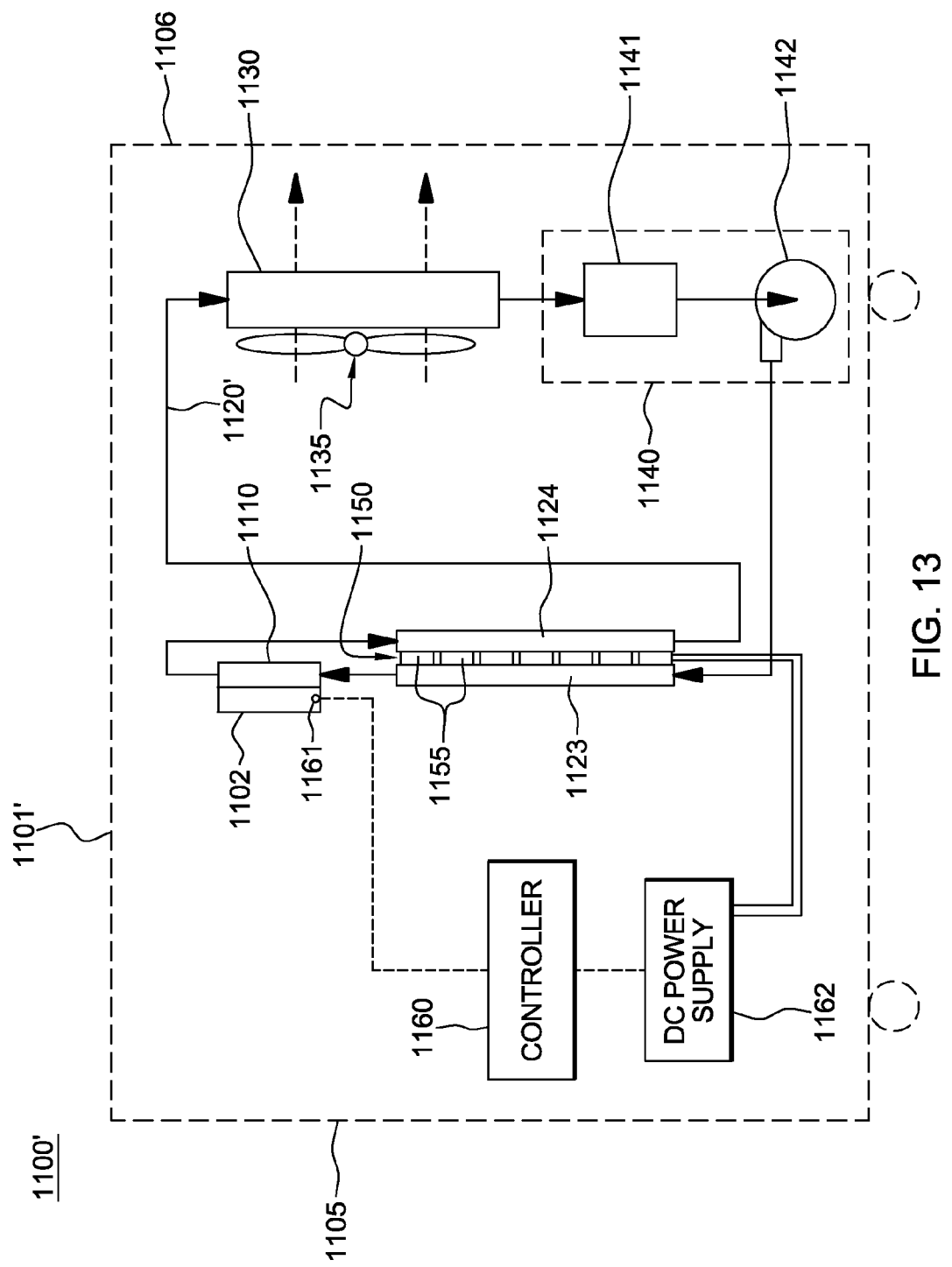
FIG. 13 is a schematic illustration of an alternate embodiment of an electronics rack and a thermoelectric-enhanced, liquid-cooling apparatus for facilitating cooling of one or more electronic components of the electronics rack, in accordance with an aspect of the present invention.

FIG. 13 illustrates an alternate embodiment of a data center 1100' comprising an electronics rack 1101' (such as electronics rack 1101 described above in connection with FIG. 11) and a thermoelectric-enhanced, liquid-cooling apparatus in accordance with an aspect of the present invention. The illustrated apparatus is similar to the apparatus described above in connection with FIG. 11 in that the apparatus includes a liquid-cooled structure 1110, a coolant loop 1120', a liquid-to-air heat exchanger 1130, a coolant pumping unit 1140 and a thermoelectric-enhanced, liquid-to-liquid heat exchange assembly 1150 comprising a first liquid-heat exchange element 1123, a plurality of thermoelectric modules 1155 and a second liquid-heat exchange element 1124 coupled in thermal communication as described above. In this implementation, the cooled coolant egressing from liquid-to-air heat exchanger 1130 passes through first liquid-heat exchange element 1123 attached to the cold side of the thermoelectric heat exchange assembly (i.e., the left side thereof in FIG. 13). This coolant flowing through the cold side element is then further cooled by the thermoelectric modules before the coolant enters liquid-cooled structure 1110, which is in thermal communication with electronic component 1102 for extracting heat therefrom. The coolant exiting liquid-cooled structure 1110 then enters the hot side element (i.e., second liquid-heat exchange element 1124) of the thermoelectric heat exchange assembly 1150, picking up heat pumped by the thermoelectric modules, plus the power dissipated by the thermoelectric modules. Coolant exiting second liquid-heat exchange element subsequently passes to liquid-to-air heat exchanger 1130, where the total heat load is rejected to ambient air.

Figure 14:
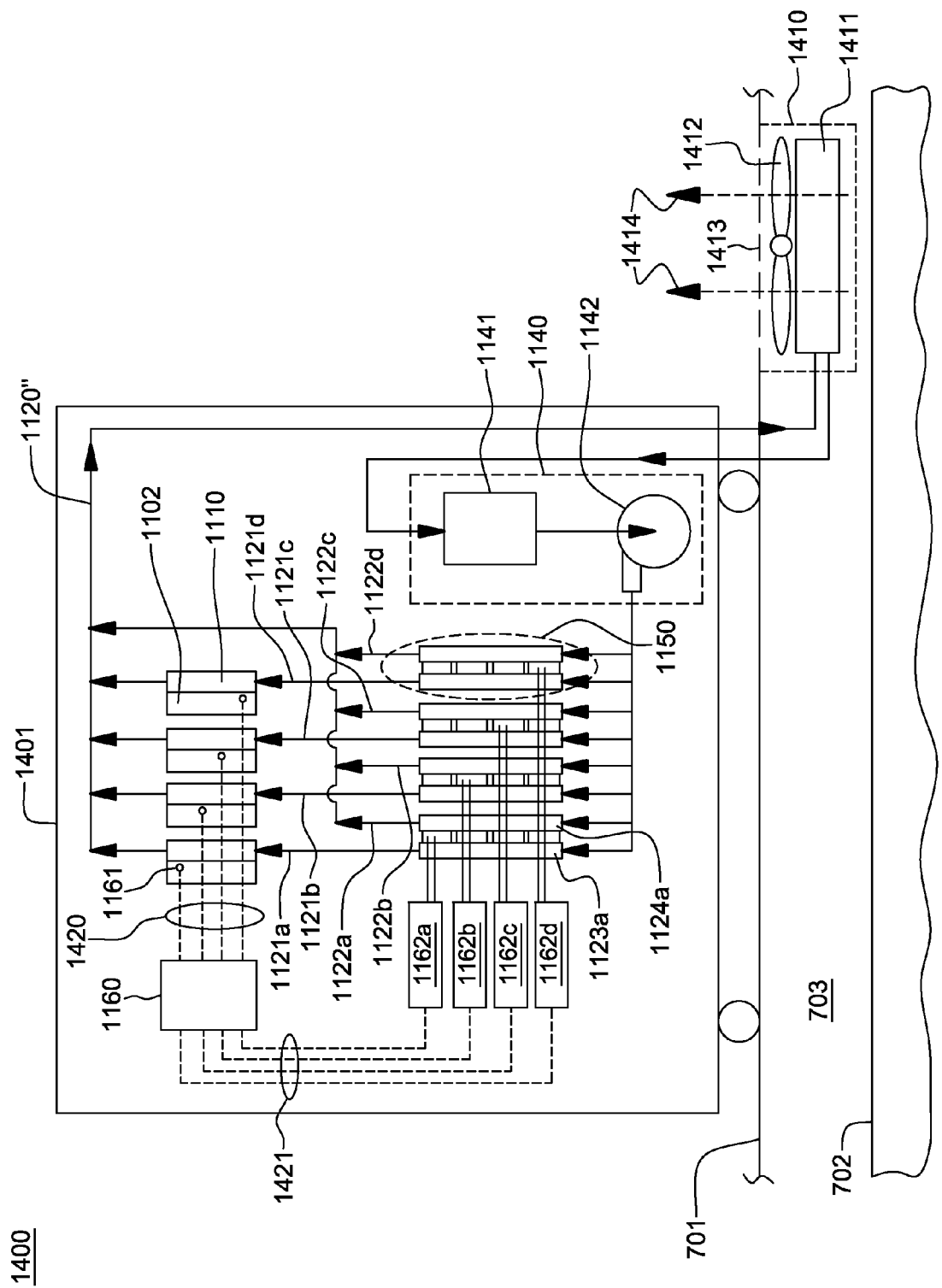
FIG. 14 is a schematic illustration of another embodiment of an electronics rack (shown within a raised floor data center) and a thermoelectric-enhanced, liquid-cooling apparatus for facilitating cooling multiple electronic components of the electronics rack, in accordance with an aspect of the present invention.

FIG. 14 illustrates an expansion on the thermoelectric-enhanced, liquid-cooling apparatus described above in connection with FIGS. 11 & 12. In this embodiment, a data center 1400 is shown to comprise an electronics rack 1400 with multiple electronic components 1102, each of which has associated therewith a liquid-cooled structure 1110 to facilitate cooling thereof. Each liquid-cooled structure is associated with a respective thermoelectric-enhanced, liquid-to-liquid heat exchange assembly 1150. Individual dedicated DC power supplies 1162a, 1162b, 1162c, 1162d provide electric current to the individual thermoelectric heat exchange assemblies 1150. As before, if one thermoelectric heat exchange assembly or its power supply fails, the affected electronic component (e.g., processor module) can continue to operate in a "cycle steering" mode. Current supplied by DC power supplies 1162a, 1162b, 1162c, 1162d is controlled by controller 1160 via control lines 1421 depending, for example, on the respective temperatures sensed by temperature sensors 1161 in thermal communication with the different electronic components. In this example, each temperature sensor 1161 is associated with a different electronic component to be cooled, and controller 1160 obtains the sensed temperatures via communication lines 1420. As shown in FIG. 14, pairs of first and second loop portions 1121a, 1122a; 1121b, 1122b; 1121c, 1122c; and 1121d, 1122d are provided coupling the cold side liquid-heat exchange element (e.g., first liquid-heat exchange element 1123a) in series fluid communication with a respective liquid-cooled structure 1110 (which is in thermal contact with one of the electronic components to be cooled). A hot side liquid-heat exchange element (e.g., second liquid-heat exchange element 1124a) of a pair of associated first and second loop portions is in thermal communication with the hot side of the respective thermoelectric modules and receives heat rejected thereby for circulation back through coolant loop 1120" to the liquid-to-air heat exchanger 1411.

In the implementation of FIG. 14, liquid-to-air heat exchanger 1411 is disposed external to electronics rack 1401. In one example, the liquid-to-air heat exchanger could be configured as a rear door heat exchanger, such as described in U.S. Pat. No. 7,385,810 B2, entitled "Apparatus and Method for Facilitating Cooling of An Electronics Rack Employing a Heat Exchange Assembly Mounted to an Outlet Door Cover of the Electronics Rack". In the embodiment of FIG. 14, however, liquid-to-air heat exchanger 1411 is provided within a modular tile assembly 1410 which defines, in part, a cool air plenum 703 of the data center 1400. As shown, the coolant pumping unit 1140, comprising reservoir 1141 and coolant pump 1142, is in fluid communication with coolant loop 1120" and disposed, for example, in a lower portion of electronics rack 1401. Although not shown, quick connect couplings could be employed to couple in fluid communication the respective coolant inlet and coolant outlet lines of liquid-to-air heat exchanger 1411 with coolant loop 1120". As shown, in operation cool air within cool air plenum 703 is drawn across liquid-to-air heat exchanger 1411 of modular tile assembly 1410, facilitated for example, via an air-moving device 1412, and exhausted as heated air 1414 through a perforated tile 1413 of the modular tile assembly 1410 into, for example, a hot air aisle of data center 1400. Note that although depicted herein with reference to the first and second loop portion configuration of the thermoelectric-enhanced, liquid-cooling apparatus of FIG. 11, the thermoelectric-enhanced, liquid-cooling apparatus of FIG. 14 could alternatively employ the serially-connected first loop portion, liquid-cooled structure, and second loop portion configuration of FIG. 13 in facilitating parallel cooling of the different electronic components in an analogous manner.

Figure 15A:
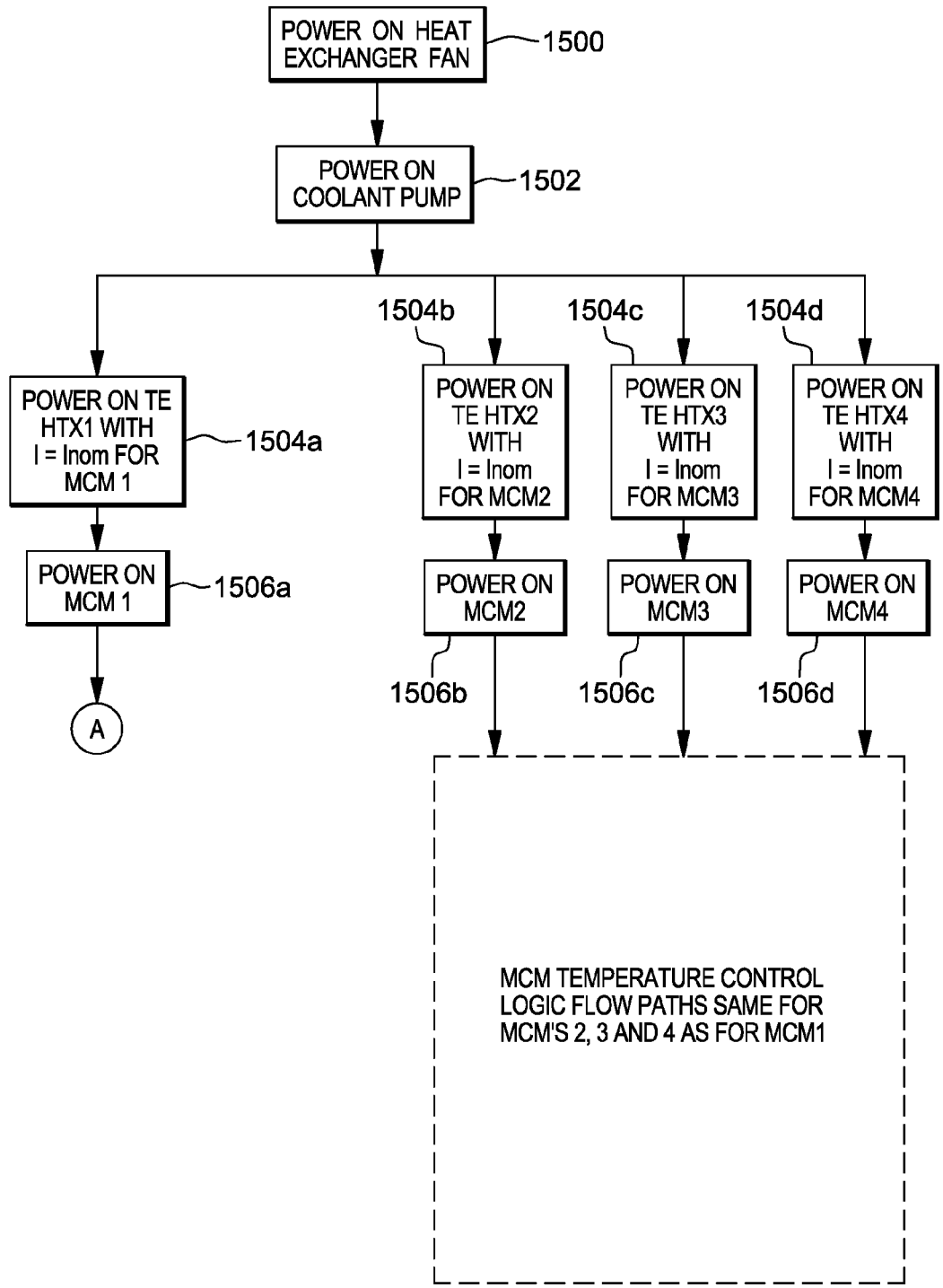
FIGS. 15A & 15B depict a flowchart of one embodiment of control processing for a thermoelectric-enhanced, liquid-cooling apparatus such as depicted in FIG. 14, in accordance with an aspect of the present invention.
Figure 15B:
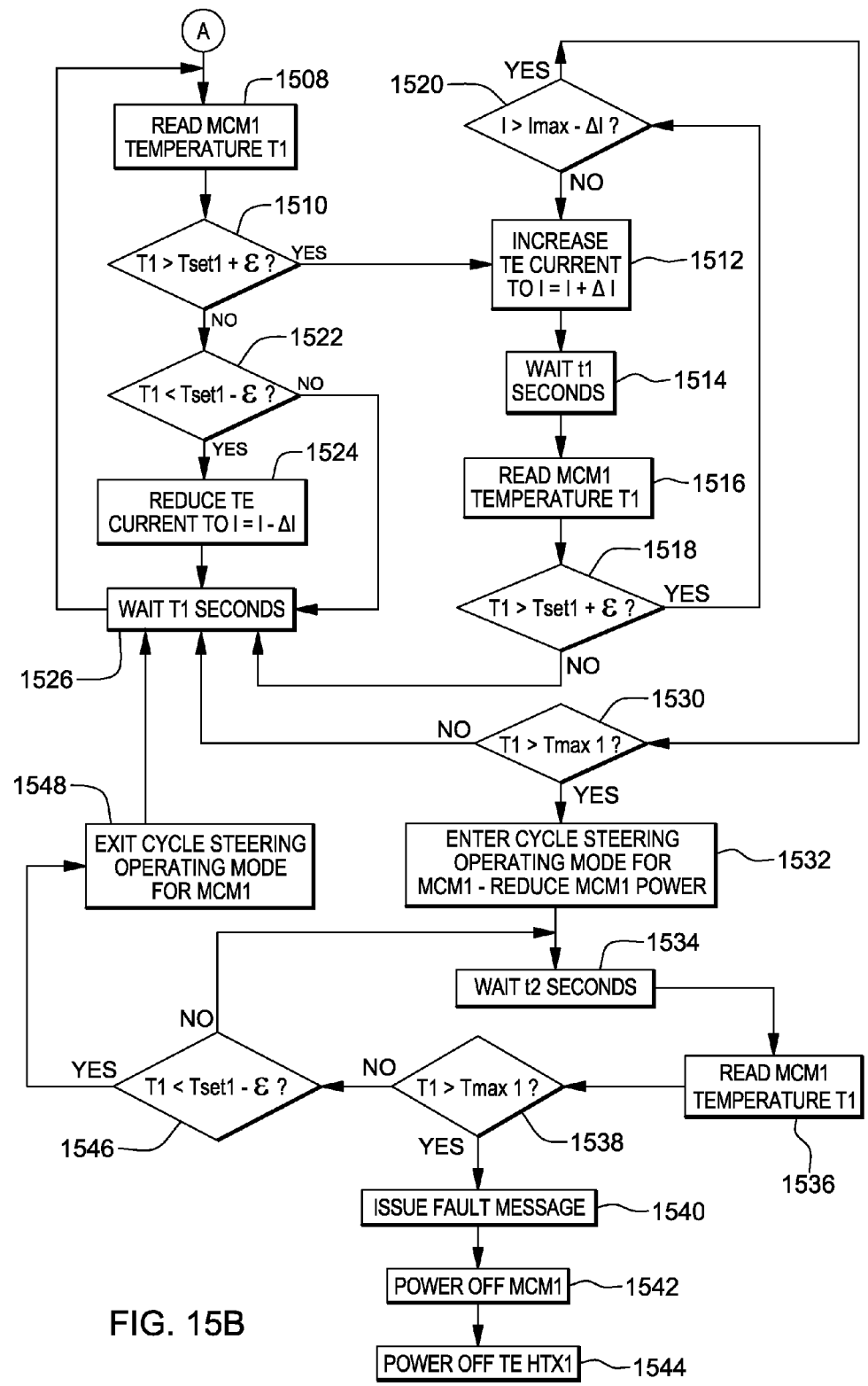

FIGS. 15A & 15B depict one embodiment of control processing for an electronics rack and thermoelectric-enhanced, liquid-cooling apparatus such as described above in connection with FIG. 14. In this example, each electronic component to be cooled is assumed to comprise a processor multichip module (MCM), and each MCM has a related thermoelectric-enhanced, liquid-to-liquid heat exchange assembly associated therewith to provide enhanced cooling and temperature control of the MCM. The processing further includes steps for entering and exiting a "cycle steering" mode, and powering down the MCM and its associated thermoelectric-enhanced, liquid-to-liquid heat exchange assembly if temperature control is lost.

As illustrated in FIG. 15A, upon initialization of the electronics rack and apparatus, power is first applied to the air-moving device(s) associated with the liquid-to-air heat exchanger 1500, after which power is applied to the coolant pump 1502 to circulate coolant through the coolant loop of the apparatus. A predetermined, nominal current (Inom) is supplied to each thermoelectric-enhanced, liquid-to-liquid heat exchange assembly (e.g., TE HTX1 associated with MCM1) 1504a. Concurrently, the thermoelectric-enhanced, liquid-to-liquid heat exchange assemblies associated with MCM2, MCM3, MCM4, etc. are also powered ON using a nominal current (Inom) 1504b, 1504c, 1504d. Following power ON of the heat exchange assemblies, power is applied to the electronic components (i.e., MCM1, MCM2, MCM3, MCM4 in this example) 1506a, 1506b, 1506c, 1506d. For simplicity the temperature control processing flow for MCM1 is depicted in FIG. 15B, with the remaining flows for MCM2, MCM3, MCM4 being substantially identical.

Referring to FIG. 15B, the temperature T1 of MCM1 is read 1508, and processing compares this temperature with a predefined set point value Tset1, plus a temperature tolerance ($\epsilon$) 1510. If temperature T1 is greater than Tset1+$\epsilon$, then the temperature of the MCM1 is above the defined, normal operating range. This could be due, for example, to an increase in the data center room air temperature, or to an increase in power dissipated by the MCM. Responsive to this condition, current supplied to the respective thermoelectric-enhanced, liquid-to-liquid heat exchange assembly is increased by an amount $\Delta I$ to increase the heat pumping capability of the respective heat exchange assembly, and thus lower the temperature of the coolant supplied to the liquid-cooled structure associated with MCM1 1512. After waiting a predefined time interval t1 1514, temperature T1 of MCM1 is read 1516 and then compared to the set point temperature (Tset1) plus the temperature tolerance ($\epsilon$) 1518. If temperature T1 is still greater then Tset1+$\epsilon$, then a check is made to determine if increasing current by an additional amount $\Delta I$ will exceed a specified maximum value (Imax) for the respective thermoelectric array 1520. If the current is within $\Delta I$ of Imax, then a further increase in current will push the thermoelectric elements beyond their maximum heat pumping ability, and actually cause a decrease in cooling capability. If so, then processing checks to determine if T1 is greater than the maximum allowable operating temperature T1 max1 1530. If not, then processing waits a period of time, for example, t1 seconds 1526, before returning to again read the temperature of MCM1 1508.

If the read temperature is less than or equal to Tset1 plus the temperature tolerance $\epsilon$, then processing determines whether the read temperature T1 is less than Tset1 minus the temperature tolerance $\epsilon$ 1522. If "no", processing waits an interval of time (such as time t1) 1526, before again reading the temperature T1 of MCM1. However, if T1 is less than Tset1−$\epsilon$, then the current to the thermoelectric modules of the associated thermoelectric-enhanced, liquid-to-liquid heat exchange assembly is reduced by, for example, an amount $\Delta I$ 1524.

From inquiry 1530, if temperature T1 is greater than the maximum allowable temperature (Tmax1), then power dissipation by the MCM is reduced and "cycle steering" operation mode is entered 1532. After waiting a time interval t2 1534, temperature T1 of MCM1 is read 1536 and then compared with the Tmax1 value to determine if the temperature of the MCM1 has been brought into an acceptable operating range 1538. If temperature T1 still exceeds Tmax1, then a fault message is issued 1540, MCM1 is powered down 1542, and the associated thermoelectric-enhanced, liquid-to-liquid heat exchange assembly is powered down 1544. Alternatively, if temperature T1 is less than the maximum allowable MCM1 temperature (i.e., Tmax1), then temperature T1 is compared to Tset1−$\epsilon$, (i.e., the lower limit of the normal operating range). If temperature T1 is equal to or greater than Tset1−$\epsilon$, then the MCM remains in cycle steering mode and another waiting period is entered 1534, repeating the loop until either temperature T1 exceeds Tmax1 or drops below Tset1−$\epsilon$. Upon dropping below Tset1−$\epsilon$, cycle steering is ended 1548, and normal module power is restored, which is followed by waiting a time period t1 1526 before again reading the temperature T1 of MCM1 1508.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating dissipation of heat from an electronic component, the apparatus comprising:
   a liquid-cooled structure, the liquid-cooled structure being coupled in thermal communication with the electronic component;
   a coolant loop coupled in fluid communication with the liquid-cooled structure, the coolant loop comprising a first loop portion and a second loop portion;
   a liquid-to-air heat exchanger coupled in fluid communication with the liquid-cooled structure via the coolant loop, and receiving coolant therefrom, the liquid-to-air heat exchanger cooling coolant passing therethrough by dissipating heat from the coolant to air passing thereacross; and
   a thermoelectric array comprising at least one thermoelectric module, the thermoelectric array being disposed with the first loop portion of the coolant loop at least partially in thermal contact with a first side thereof, and the second loop portion of the coolant loop at least partially in thermal contact with a second side thereof, wherein the thermoelectric array operates to transfer heat from coolant passing through the first loop portion to coolant passing through the second loop portion, the thermoelectric array cooling coolant passing through the first loop portion before the coolant passes through the liquid-cooled structure, and wherein the coolant passing through the first loop portion, after passing through the liquid-cooled structure, passes through the liquid-to-air heat exchanger for cooling thereof and the coolant passing through the second loop portion, after receiving heat via the thermoelectric array, passes through the liquid-to-air heat exchanger for cooling thereof.

2. The apparatus of claim 1, wherein the first loop portion comprises a first coolant branch of the coolant loop and the second loop portion comprises a second coolant branch of the coolant loop, the first coolant branch and the second flow branch being in parallel fluid communication in the coolant loop.

3. The apparatus of claim 2, wherein the first coolant branch comprises a first liquid-heat exchange element and the second coolant branch comprises a second liquid-heat exchange element, and wherein the first liquid-heat exchange element is in thermal communication with the first side of the thermoelectric array and the second liquid-heat exchange element is in thermal communication with the second side of the thermoelectric array.

4. The apparatus of claim 3, wherein the liquid-cooled structure is coupled in series fluid communication with the first liquid-heat exchange element within the first coolant branch.

5. The apparatus of claim 4, wherein the apparatus, including the liquid-to-air heat exchanger, is disposed within an electronics rack comprising the electronic component to be cooled, and wherein the apparatus further comprises an air-moving device associated with the liquid-to-air heat exchanger for facilitating movement of air across the liquid-to-air heat exchanger.

6. The apparatus of claim 4, wherein the electronic component is disposed within an electronics rack, and wherein the liquid-to-air heat exchanger is disposed external to the electronics rack in a modular tile assembly defining, in part, a cool air plenum of a data center containing the electronics rack.

7. The apparatus of claim 1, wherein the first loop portion, the liquid-cooled structure and the second loop portion are disposed in series fluid communication, with the liquid-cooled structure disposed between the first loop portion and the second loop portion.

8. The apparatus of claim 7, wherein the first loop portion comprises a first liquid-heat exchange element and the second loop portion comprises a second liquid-heat exchange element, and wherein the first liquid-heat exchange element is in thermal communication with the first side of the thermoelectric array, and the second liquid-heat exchange element is in thermal communication with the second side of the thermoelectric array.

9. The apparatus of claim 1, further comprising a controller for controlling the thermoelectric array, and an adjustable power supply providing power to the thermoelectric array, the controller being coupled to at least one temperature sensor in thermal communication with the electronic component, and the controller determining whether a temperature sensed by the at least one temperature sensor is within a defined acceptable temperature range, and responsive to the temperature being outside the defined acceptable temperature range, the controller automatically adjusting a current supplied to the thermoelectric array by the adjustable power supply to dynamically adjust the transfer of heat by the thermoelectric array from coolant passing through the first loop portion to coolant passing through the second loop portion to move temperature sensed by the at least one temperature sensor towards the defined acceptable temperature range.

10. A cooled electronic system comprising:
    a plurality of electronic components to be cooled; and
    an apparatus for facilitating dissipation of heat from the plurality of electronic components to be cooled, the apparatus comprising:
      a plurality of liquid-cooled structures, each liquid-cooled structure being coupled in thermal communication with a respective electronic component of the plurality of electronic components;
      a coolant loop coupled in fluid communication with the plurality of liquid-cooled structures, the coolant loop comprising a plurality of first loop portions and a plurality of associated, second loop portions;
      a liquid-to-air heat exchanger coupled in fluid communication with the plurality of liquid-cooled structures via the coolant loop, and receiving coolant therefrom, the liquid-to-air heat exchanger cooling coolant passing therethrough by dissipating heat from the coolant to air passing thereacross; and
      a plurality of thermoelectric arrays, each thermoelectric array comprising at least one thermoelectric module, and each thermoelectric array being disposed with a first loop portion of the plurality of loop portions of the coolant loop at least partially in thermal contact with a first side thereof, and a second loop portion of the plurality of second loop portions of the coolant loop at least partially in thermal contact with a second side thereof, wherein the thermoelectric array operates to transfer heat from coolant passing through the first loop portion to coolant passing through the second loop portion, the thermoelectric array cooling coolant passing through the first loop portion before the coolant passes through a respective liquid-cooled structure of the plurality of liquid-cooled structures, and wherein the coolant passing through the first loop portion, after passing through the respective liquid-cooled structure, passes through the liquid-to-air heat exchanger for cooling thereof and the coolant passing through the second loop portion, after receiving heat via the thermoelectric array, passes through the liquid-to-air heat exchanger for cooling thereof.

11. The cooled electronic system of claim 10, wherein a first loop portion of the plurality of first loop portions comprises a first coolant branch of the coolant loop and a second loop portion of the plurality of second loop portions comprises a second coolant branch of the coolant loop, the first coolant branch and the second coolant branch being in parallel fluid communication in the coolant loop.

12. The cooled electronic system of claim 11, wherein the first coolant branch comprises a first liquid-heat exchange element and the second coolant branch comprises a second liquid-heat exchange element, and wherein the first liquid-heat exchange element is in thermal communication with the first side of the respective thermoelectric array and the second liquid-heat exchange element is in thermal communication with the second side of the respective thermoelectric array.

13. The cooled electronic system of claim 12, wherein the respective liquid-cooled structure is coupled in series fluid communication with the first liquid-heat exchange element within the first coolant branch.

14. The cooled electronic system of claim 10, wherein a first loop portion of the plurality of loop portions, a liquid-cooled structure of the plurality of liquid-cooled structures, and a second loop portion of the plurality of second loop portions, are disposed in series fluid communication, with the liquid-cooled structure disposed between the first loop portion and the second loop portion.

15. The cooled electronic system of claim 14, wherein the first loop portion comprises a first liquid-heat exchange element and the second loop portion comprises a second liquid-heat exchange element, and wherein the first liquid-heat exchange element is in thermal communication with the first side of the respective thermoelectric array, and the second liquid-heat exchange element is in thermal communication with the second side of the respective thermoelectric array.

16. The cooled electronic system of claim 10, wherein the apparatus further comprises a controller for controlling the plurality of thermoelectric arrays, the controller being coupled to a plurality of temperature sensors in thermal communication with the plurality of electronic components, and the apparatus further comprising a plurality of adjustable power supplies, each powering a respective thermoelectric array of the plurality of thermoelectric arrays, wherein the controller determines whether a temperature sensed by a temperature sensor of the plurality of temperature sensors is within a defined acceptable temperature range, and responsive to the temperature sensed being outside the defined acceptable temperature range, the controller automatically adjusts a current supplied to a thermoelectric array of the plurality of thermoelectric arrays by a power supply of the plurality of power supplies to dynamically adjust the transfer of heat by that thermoelectric array from coolant passing through the respective first loop portion to coolant passing through the respective second loop portion to move the temperature towards the defined acceptable temperature range.

17. A method of facilitating cooling of an electronic component, the method comprising:
coupling in thermal communication a liquid-cooled structure with the electronic component;
coupling in fluid communication a coolant loop with the liquid-cooled structure, the coolant loop comprising a first loop portion and a second loop portion;
providing a liquid-to-air heat exchanger coupled in fluid communication with the liquid-cooled structure via the coolant loop, and receiving coolant therefrom, the liquid-to-air heat exchanger cooling coolant passing therethrough by dissipating heat from the coolant to air passing thereacross; and
disposing a thermoelectric array, comprising at least one thermoelectric module, between the first loop portion and the second loop portion, with the first loop portion of the coolant loop at least partially being in thermal contact with a first side of the thermoelectric array and the second loop portion of the coolant loop at least partially being in thermal contact with a second side of the thermoelectric array, wherein the thermoelectric array operates to transfer heat from coolant passing through the first loop portion to coolant passing through the second loop portion, the thermoelectric array cooling coolant passing through the first loop portion before the coolant passes through the liquid-cooled structure, and wherein the coolant passing through the first loop portion, after passing through the liquid-cooled structure, passes through the liquid-to-air heat exchanger for cooling thereof and the coolant passing through the second loop portion, after receiving heat via the thermoelectric array, passes through the liquid-to-air heat exchanger for cooling thereof.

18. The method of claim 17, wherein the first loop portion comprises a first coolant branch of the coolant loop and the second loop portion comprises a second coolant branch of the coolant loop, the first coolant branch and the second coolant branch being in parallel fluid communication in the coolant loop, the first coolant branch comprising a first liquid-heat exchange element and the second coolant branch comprising a second liquid-heat exchange element, and wherein the first liquid-heat exchange element is in thermal communication with the first side of the thermoelectric array and the second liquid-heat exchange element is in thermal communication with the second side of the thermoelectric array, and wherein the liquid-cooled structure is coupled in series fluid communication with the first liquid-heat exchange element within the first coolant branch.

19. The method of claim 17, wherein the first loop portion, the liquid-cooled structure and the second loop portion are disposed in series fluid communication, with the liquid-cooled structure disposed between the first loop portion and the second loop portion.

20. The method of claim 17, further comprising controlling the thermoelectric array via a controller and an adjustable power supply providing power to the thermoelectric array, the controller being coupled to at least one temperature sensor in thermal communication with the electronic component, the controller determining whether a temperature sensed by the at least one temperature sensor is within a defined acceptable temperature range, and responsive to the temperature being outside the defined acceptable temperature range, the controller automatically adjusts a current supplied to the thermoelectric array by the adjustable power supply to dynamically adjust the transfer of heat by the thermoelectric array from coolant passing through the first loop portion to coolant passing through the second loop portion to move temperature sensed by the at least one temperature sensor towards the defined acceptable temperature range.

* * * * *